United States Patent
Song et al.

(10) Patent No.: US 12,020,758 B2
(45) Date of Patent: Jun. 25, 2024

(54) NONVOLATILE MEMORY DEVICE, STORAGE DEVICE INCLUDING NONVOLATILE MEMORY DEVICE, AND OPERATING METHOD OF STORAGE DEVICE

(71) Applicant: SAMSUNG ELECTRONICS CO., LTD., Suwon-si (KR)

(72) Inventors: Kun-Woo Song, Hwaseong-si (KR); Jonghwa Kim, Seoul (KR); Kyungyong Jeoung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 446 days.

(21) Appl. No.: 17/318,597

(22) Filed: May 12, 2021

(65) Prior Publication Data
US 2022/0129199 A1    Apr. 28, 2022

(30) Foreign Application Priority Data
Oct. 28, 2020    (KR) .................. 10-2020-0141067

(51) Int. Cl.
*G11C 11/34*    (2006.01)
*G11C 16/04*    (2006.01)
(Continued)

(52) U.S. Cl.
CPC ...... *G11C 16/3431* (2013.01); *G11C 16/0483* (2013.01); *G11C 16/34* (2013.01);
(Continued)

(58) Field of Classification Search
CPC . G11C 16/3431; G11C 16/0483; G11C 16/34; G11C 16/10
(Continued)

(56) References Cited

U.S. PATENT DOCUMENTS 7,679,133 B2    3/2010    Son et al.
8,553,466 B2    10/2013    Han et al.
(Continued)

FOREIGN PATENT DOCUMENTS

CN    107924701 A    4/2018
JP    2007207343 A    8/2007

OTHER PUBLICATIONS

W-J Tsai, et al. Polycrystalline-Silicon Channel Trap Induced Transient Read Instability in a 3D NAND Flash Cell String, Macronix International Co., No. 16, Li-Hsin Road, Science Park, Hsin-Chu, Taiwan, R.O.C., IEDM16-288-IEDM16-291.

*Primary Examiner* — Vu A Le
(74) *Attorney, Agent, or Firm* — Fish & Richardson P.C.

(57) ABSTRACT

Disclosed is a storage device, which includes a nonvolatile memory device including a first memory block connected with a plurality of first word lines, and a memory controller connected with the nonvolatile memory device through a plurality of data lines. The memory controller sends a first command to the nonvolatile memory device through the plurality of data lines during a first command input period, sends a parameter to the nonvolatile memory device through the plurality of data lines during an address input period, and sends a second command to the nonvolatile memory device through the plurality of data lines during a second command input period. The nonvolatile memory device applies a turn-on voltage to all the plurality of first word lines connected with the first memory block based on the parameter during a first time in response to the first command and the second command.

13 Claims, 20 Drawing Sheets

(51) Int. Cl.
  *G11C 16/34* (2006.01)
  *G11C 16/10* (2006.01)
  *G11C 16/26* (2006.01)
  *H10B 43/27* (2023.01)
(52) U.S. Cl.
  CPC .............. *G11C 16/10* (2013.01); *G11C 16/26* (2013.01); *H10B 43/27* (2023.02)
(58) Field of Classification Search
  USPC .................................................. 365/185.18
  See application file for complete search history.

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 9,275,730 B2 | 3/2016 | Tortorelli et al. |
| 9,753,657 B2 | 9/2017 | Yang et al. |
| 9,911,500 B2 | 3/2018 | Pang et al. |
| 10,026,486 B1 | 7/2018 | Dutta et al. |
| 10,235,294 B1 | 3/2019 | Lu et al. |
| 2011/0233648 A1 | 9/2011 | Seol et al. |
| 2015/0370629 A1* | 12/2015 | Song .................. G06F 11/1048 714/721 |
| 2017/0092361 A1 | 3/2017 | Kang et al. |
| 2017/0092366 A1* | 3/2017 | Hwang ................ G06F 3/0616 |
| 2018/0075912 A1 | 3/2018 | Shimizu et al. |
| 2018/0197608 A1 | 7/2018 | Song et al. |
| 2018/0276070 A1 | 9/2018 | Lin et al. |
| 2020/0218473 A1 | 7/2020 | Takada et al. |

* cited by examiner

FIG. 13

|  | DQ1 | DQ2 | DQ3 | DQ4 | DQ5 | DQ6 | DQ7 | DQ8 |
|---|---|---|---|---|---|---|---|---|
| Cycle1 | CP1 | CP2 | CP3 | CP4 | rsvd | | | |
| Cycle2 | Start BLK ADDR | | | | | | | |
| Cycle3 | the number of BLK | | | | | | | |
| Cycle4 | Cure Voltage Level | | | | | | | |
| Cycle5 | Cure Time | | | | | | | |

NONVOLATILE MEMORY DEVICE, STORAGE DEVICE INCLUDING NONVOLATILE MEMORY DEVICE, AND OPERATING METHOD OF STORAGE DEVICE

CROSS-REFERENCE TO RELATED APPLICATIONS

This application claims priority under 35 U.S.C. § 119 to Korean Patent Application No. 10-2020-0141067 filed on Oct. 28, 2020, in the Korean Intellectual Property Office, the disclosure of which is incorporated by reference herein in its entirety.

BACKGROUND

Embodiments of the present disclosure described herein relate to a semiconductor memory, and more particularly, relate to a nonvolatile memory device, a storage device including the nonvolatile memory device, and an operation method of the storage device.

Semiconductor memories are classified into volatile memory devices, which lose data stored therein when a power supply voltage is turned off, such as a static random access memory (SRAM), a dynamic RAM (DRAM), and a synchronous DRAM (SDRAM) and nonvolatile memory devices, which retain data stored therein even when a power supply voltage is turned off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

As semiconductor manufacturing technologies develop, there is a continuous increase in the degree of integration and capacity of the storage device. The high degree of integration of the storage device makes it possible to reduce costs needed to manufacture the storage device. However, if the storage device is scaled down due to the high degree of integration thereof, various new issues occur. Since such issues cause a damage of data stored in the storage device, the reliability of the storage device may decrease.

SUMMARY

Embodiments of the present disclosure provide a nonvolatile memory device with improved performance, a storage device including the nonvolatile memory device, and an operating method of the storage device.

According to an embodiment, a storage device includes a nonvolatile memory device that includes a first memory block connected with a plurality of first word lines and a memory controller that is connected with the nonvolatile memory device through a plurality of data lines. The memory controller sends a first command to the nonvolatile memory device through the plurality of data lines during a first command input period, sends a parameter to the nonvolatile memory device through the plurality of data lines during an address input period, and sends a second command to the nonvolatile memory device through the plurality of data lines during a second command input period. The nonvolatile memory device applies a turn-on voltage to all the plurality of first word lines connected with the first memory block based on the parameter during a first time in response to the first command and the second command.

According to an embodiment, a nonvolatile memory device includes a memory cell array that includes a plurality of memory blocks, a control logic circuit that receives commands from an external device, and an address decoder that is connected with the memory cell array through a plurality of word lines and applies a turn-on voltage to the plurality of word lines connected with the plurality of memory blocks under control of the control logic circuit receiving a command.

According to an embodiment, an operating method of a storage device, which includes a nonvolatile memory device including a plurality of memory blocks and a memory controller, includes sending by the memory controller a first command to the nonvolatile memory device through a plurality of data lines during a first command input period, sending by the memory controller a parameter to the nonvolatile memory device through the plurality of data lines during an address input period after the first command input period, sending by the memory controller a second command to the nonvolatile memory device through the plurality of data lines during a second command input period after the address input period, receiving by the memory controller a ready/busy signal of a busy state through a ready/busy line during a first time after the second command input period, and applying by the nonvolatile memory device a turn-on voltage to all word lines connected with the plurality of memory blocks in response to the first and second commands.

According to an embodiment, a storage device includes a nonvolatile memory device that includes a plurality of memory blocks and a memory controller that sends a first command, a parameter, and a second command to the nonvolatile memory device through a plurality of data lines. The nonvolatile memory device applies a turn-on voltage to all word lines connected with the plurality of memory blocks based on the parameter in response to the first and second commands.

BRIEF DESCRIPTION OF THE FIGURES

The above and other objects and features of the present disclosure will become apparent by describing in detail embodiments thereof with reference to the accompanying drawings.

FIG. 13 is a diagram illustrating cure information.

DETAILED DESCRIPTION

Below, embodiments of the present disclosure may be described in detail and clearly to such an extent that one skilled in the art easily implements the present disclosure.

Figure 1:
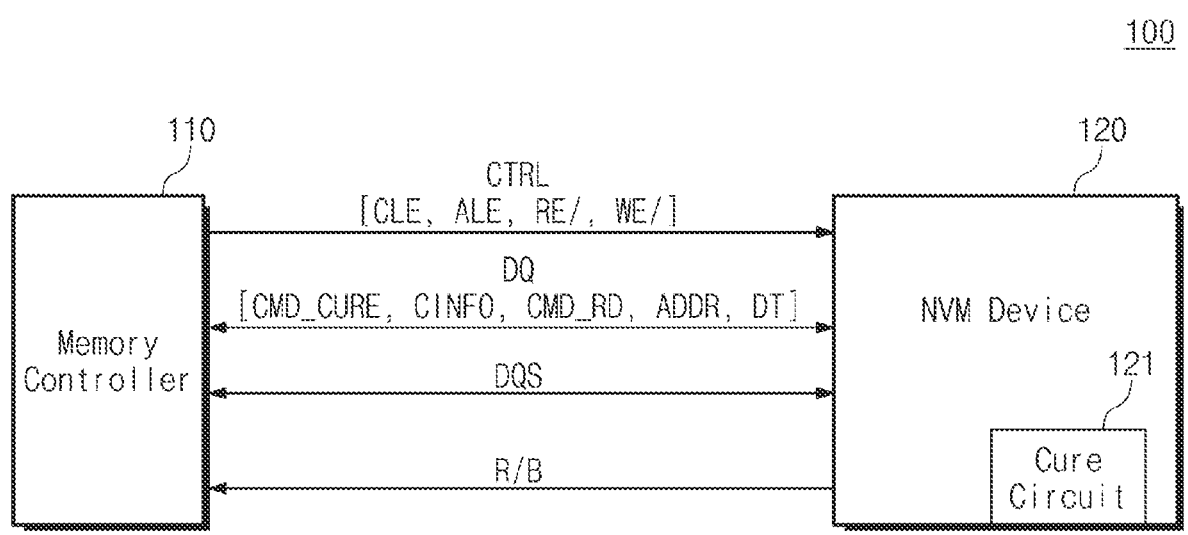
FIG. 1 is a block diagram illustrating a storage device according to an embodiment of the present disclosure.

FIG. 1 is a block diagram illustrating a storage device according to an embodiment of the present disclosure. Referring to FIG. 1, a storage device 100 may include a memory controller 110 and a nonvolatile memory device 120. In an embodiment, the storage device 100 may be a high-capacity storage medium, which is used in a computing device, such as a solid state drive (SSD) or a memory card.

The memory controller 110 may be configured to control the nonvolatile memory device 120 in response to a request of an external device (e.g., a host, a central processing unit (CPU), or an application processor (AP)) or under control of the external device. For example, to control the nonvolatile memory device 120, the memory controller 110 may exchange various signals with the nonvolatile memory device 120 through control signal lines CTRL, data lines DQ, or a data strobe signal DQS.

In an embodiment, various signals such as a command latch enable signal CLE, an address latch enable signal ALE, a read enable signal RE/, and a write enable signal WE/ may be provided to the nonvolatile memory device 120 through the control signal lines CTRL.

A variety of information such as a cure command CMD_CURE, cure information CINFO, a read command CMD_RD, an address ADDR, and data DT may be exchanged between the memory controller 110 and the nonvolatile memory device 120 through the data lines DQ. In an embodiment, the memory controller 110 and the nonvolatile memory device 120 may distinguish and identify the command CMD, the address ADDR, and the data DT provided through the data lines DQ, based on various signals provided through the control signal lines CTRL and the data strobe signal DQS.

In an embodiment, the memory controller 110 may direct the nonvolatile memory device 120 to perform a cure operation according to an embodiment of the present disclosure. That is, the memory controller 110 may send the cure command CMD_CURE and the cure information CINFO to the nonvolatile memory device 120. For example, the cure operation may indicate an operation in which a cure voltage is applied to a plurality of word lines of a memory cell array in the nonvolatile memory device 120.

In response to various signals from the memory controller 110, the nonvolatile memory device 120 may store the data DT received from the memory controller 110 or may send the stored data DT to the memory controller 110. In an embodiment, in the case where the nonvolatile memory device 120 performs a program operation or a read operation under control of the memory controller 110, the nonvolatile memory device 120 may provide a ready/busy signal R/B to the memory controller 110, and the memory controller 110 may recognize that the nonvolatile memory device 120 is operating in response to the ready/busy signal R/B. In an embodiment, in the case where the ready/busy signal R/B indicates a busy state, the memory controller 110 may not exchange information (e.g., a command, an address, or data) with the nonvolatile memory device 120.

In an embodiment, the nonvolatile memory device 120 may include a NAND flash memory. However, the present disclosure is not limited thereto. For example, the nonvolatile memory device 120 may include at least one of various memory devices such as a static random access memory (SRAM), a DRAM, a synchronous DRAM (SDRAM), a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

In an embodiment, the nonvolatile memory device 120 may include a cure circuit 121. The cure circuit 121 may perform the cure operation in response to the cure command CMD_CURE received from the memory controller 110. That is, the cure circuit 121 may control an address decoder such that a cure voltage is applied to a plurality of word lines of a memory cell array.

A conventional nonvolatile memory device may perform a dummy read operation to prevent a threshold voltage from decreasing over time. In particular, to apply voltages to all the word lines, the conventional nonvolatile memory device needs to repeatedly perform the dummy read operation as much as the number of memory blocks. In contrast, the nonvolatile memory device 120 according to the present disclosure may apply the cure voltage to all the word lines in response to the cure command CMD_CURE, without a plurality of dummy read operations. Accordingly, the nonvolatile memory device 120 with improved performance is provided. The cure operation of the nonvolatile memory device 120 according to the present disclosure will be described with reference to the following drawings.

Figure 2:
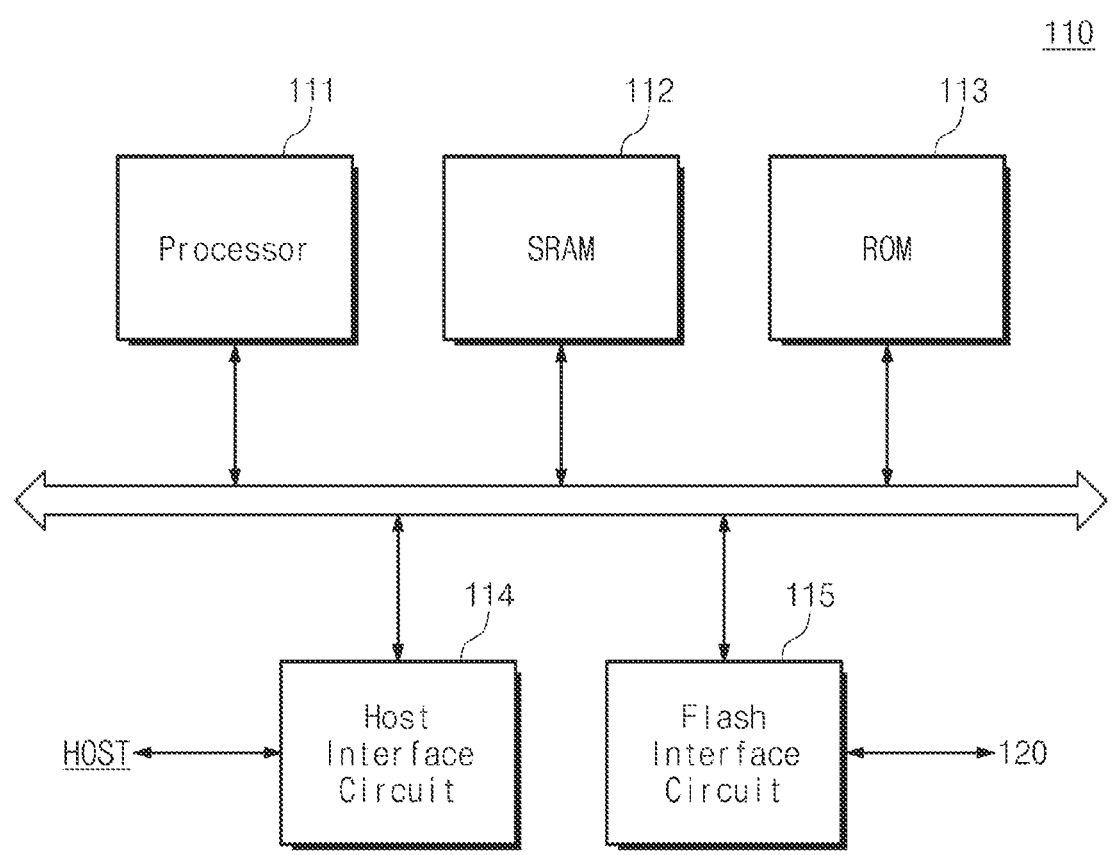
FIG. 2 is a block diagram illustrating a memory controller of FIG. 1.

FIG. 2 is a block diagram illustrating a memory controller of FIG. 1. Referring to FIGS. 1 and 2, the memory controller 110 may include a processor 111, an SRAM 112, a ROM 113, a host interface circuit 114, and a flash interface circuit 115.

The processor 111 may control overall operations of the memory controller 110. The SRAM 112 may be used as a cache memory, a working memory, or a buffer memory of the memory controller 110. The ROM 113 may store a variety of information, which is necessary for the memory controller 110 to operate, in the form of firmware.

In an embodiment, a variety of information (e.g., a flash translation layer and a mapping table) necessary to control the nonvolatile memory device 120 may be stored in the SRAM 112 or a separate buffer memory and may be managed or driven by the processor 111.

The memory controller 110 may communicate with an external device (e.g., a host) through the host interface circuit 114. In an embodiment, the host interface circuit 114 may be based on at least one of various interfaces such as a double data rate (DDR) interface, a low-power DDR (LPDDR) interface, a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a universal flash storage (UFS) interface.

The memory controller 110 may communicate with the nonvolatile memory device 120 through the flash interface circuit 115. In an embodiment, the memory controller 110 may provide various signals (e.g., CLE, ALE, RE/, WE/, CMD, ADDR, and DT) to the nonvolatile memory device 120 based on the flash interface circuit 115. In an embodiment, the flash interface circuit 115 may include a NAND interface such as a toggle NAND interface or an open NAND flash interface (ONFI).

The memory controller 110 illustrated in FIG. 2 is an example, and the present disclosure is not limited thereto. The memory controller 110 may further include various components such as an error correction code (ECC) engine, a randomizer, and a buffer management circuit.

Figure 3:
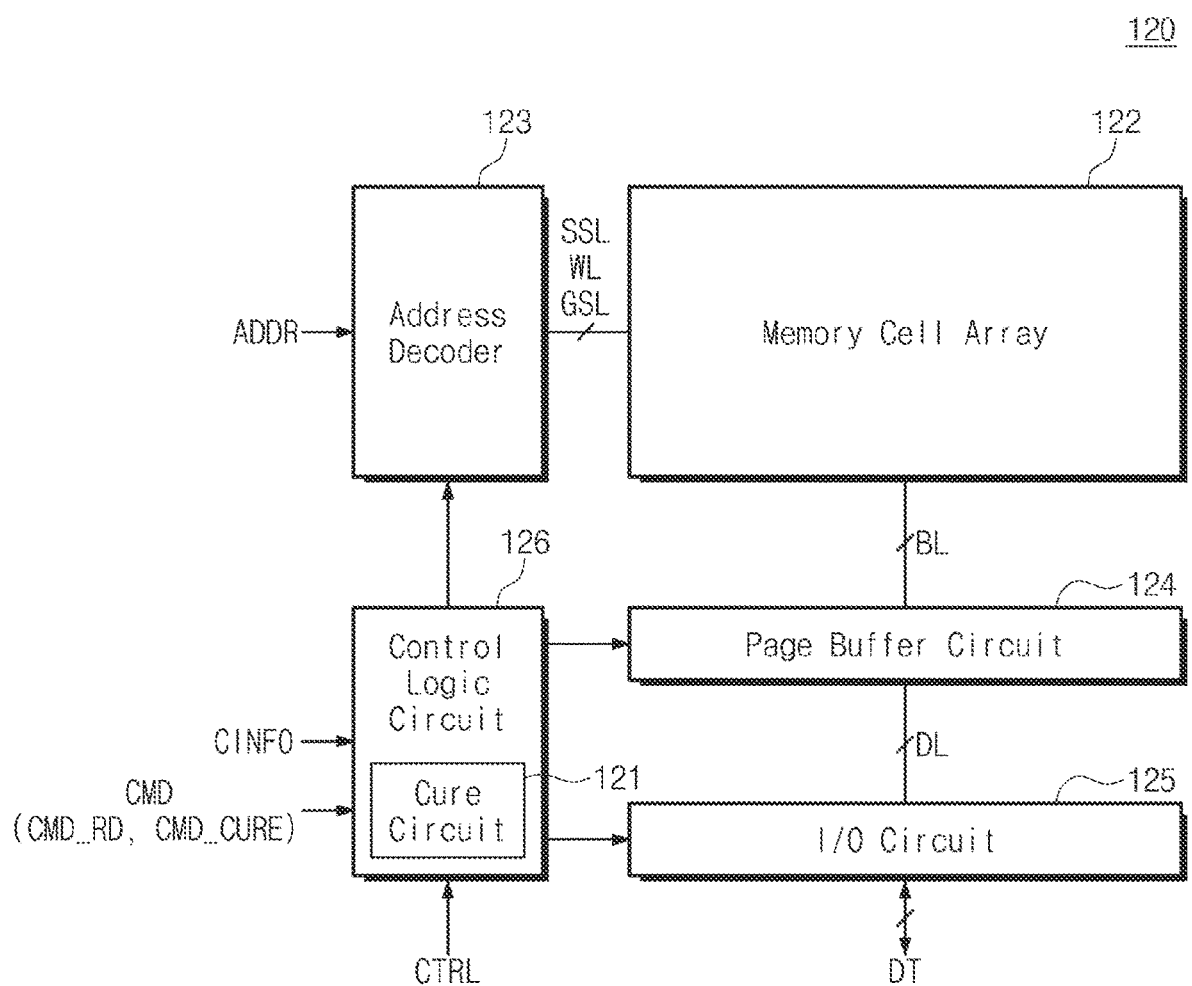
FIG. 3 is a block diagram illustrating a nonvolatile memory device of FIG. 1.

FIG. 3 is a block diagram illustrating a nonvolatile memory device of FIG. 1. Referring to FIGS. 1 and 3, the nonvolatile memory device 120 may include a memory cell array 122, an address decoder 123, a page buffer circuit 124, an input/output circuit 125, and a control logic circuit 126.

In an embodiment, for brevity of drawing and for convenience of description, the command CMD, the address ADDR, and the data DT are separately illustrated, but the present disclosure is not limited thereto. For example, the command CMD (e.g., the read command CMD_RD or the cure command CMD_CURE), the address ADDR, the data DT, the cure information CINFO may be received from the memory controller 110 through the data lines DQ and may be distinguished from each other based on control signals CTRL (e.g., CLE, ALE, RE/, and WE/).

The memory cell array 122 may include a plurality of memory blocks. Each of the plurality of memory blocks may include a plurality of cell strings, the plurality of cell strings may be connected with bit lines BL and each of the plurality of cell strings may include a plurality of cell transistors connected in series. The plurality of cell transistors may be connected with word lines WL, string selection lines SSL, and ground selection lines GSL.

The address decoder 123 may be connected with the memory cell array 122 through the string selection lines SSL, the word lines WL, and the ground selection lines GSL. The address decoder 123 may receive the address ADDR from the memory controller 110. The address decoder 123 may decode the address ADDR and may control voltages of the string selection lines SSL, the word lines WL, and the ground selection lines GSL based on the decoded result.

In an embodiment, the address decoder 123 according to an embodiment of the present disclosure may apply a cure voltage to all the word lines WL during a given time under control of the control logic circuit 126. A level of the cure voltage may be determined in advance. For example, the level of the cure voltage may be the same as a level of a read pass voltage that is applied to unselected word lines in a read operation.

The page buffer circuit 124 is connected with the memory cell array 122 through the bit lines BL. The page buffer circuit 124 may be configured to temporarily store data to be stored in the memory cell array 122 or data read from the memory cell array 122.

The input/output circuit 125 may provide the data DT received from the memory controller 110 to the page buffer circuit 124 through data lines DL. The input/output circuit 125 may provide the data DT received from the page buffer circuit 124 through data lines DL to the memory controller 110.

The control logic circuit 126 may receive the command CMD from the memory controller 110 and may control components of the nonvolatile memory device 120 such that an operation corresponding to the received command CMD is performed. The control logic circuit 126 may generate various voltages necessary for the nonvolatile memory device 120 to operate. For example, the control logic circuit 126 may generate various voltages such as a plurality of read voltages, a read pass voltage, and a cure voltage. The voltages may be generated by the control logic circuit 126 and may be provided to a relevant word line through the address decoder 123 or to a substrate where the nonvolatile memory device 120 is formed.

In an embodiment, the control logic circuit 126 may include the cure circuit 121. The cure circuit 121 may receive the cure command CMD_CURE and the cure information CINFO. In the case where the command CMD received from the memory controller 110 is the cure command CMD_CURE, the cure circuit 121 may control the address decoder 123 based on the cure information CINFO. For example, the cure voltage may be generated by the cure circuit 121 and may be provided to a plurality of word lines through the address decoder 123.

Figure 4:
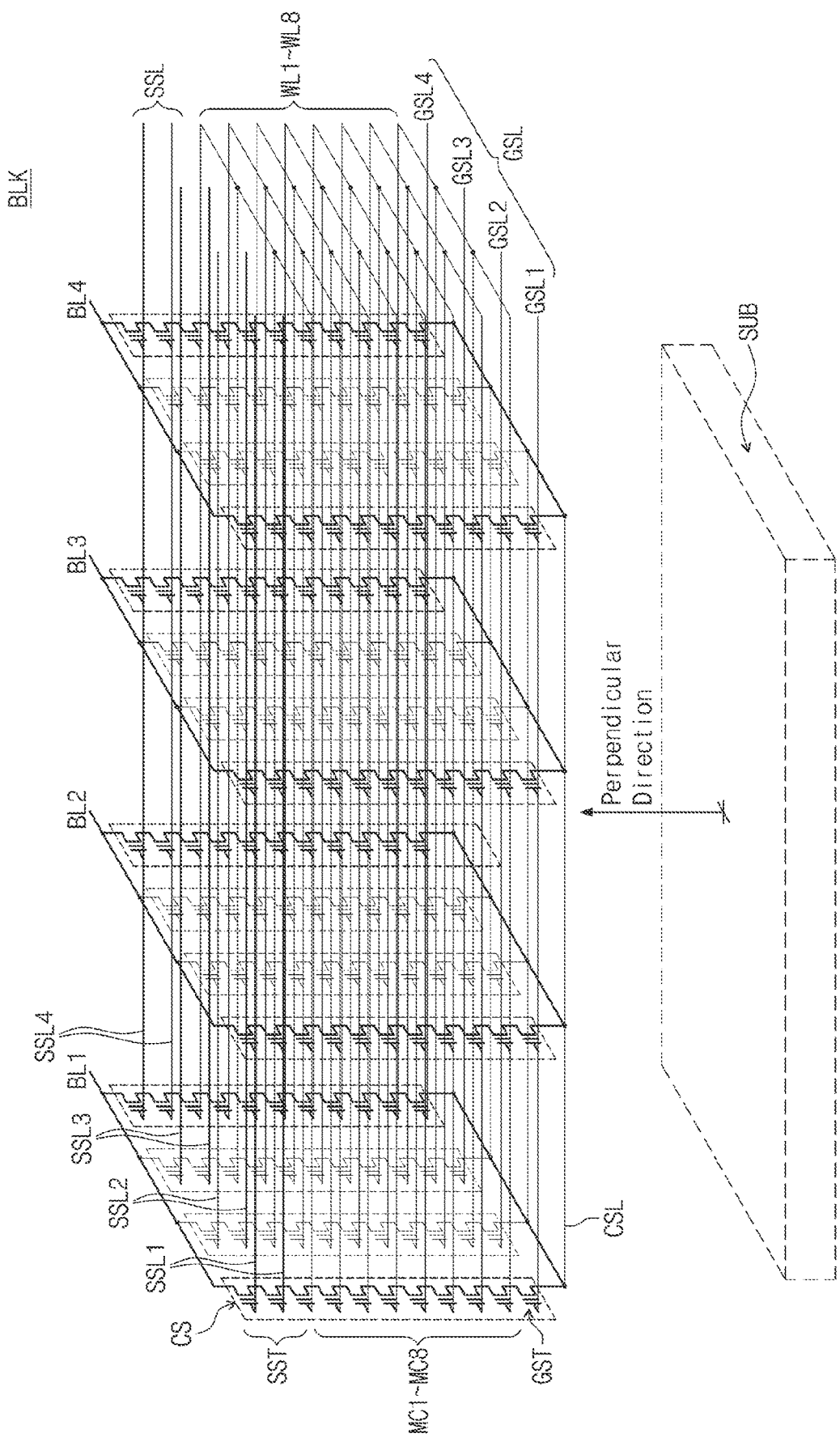
FIG. 4 is a circuit diagram illustrating one memory block BLK of a plurality of memory blocks included in a memory cell array of FIG. 3.

FIG. 4 is a circuit diagram illustrating one memory block BLK of a plurality of memory blocks included in a memory cell array of FIG. 3. One memory block BLK will be described with reference to FIG. 4, but the present disclosure is not limited thereto. A plurality of memory blocks included in the memory cell array 122 may have a structure that is the same as or similar to the structure of the memory block BLK illustrated in FIG. 4.

A plurality of cell strings CS may be arranged on a substrate SUB in rows and columns. The plurality of cell strings CS may be connected in common with a common source line CSL formed on (or in) the substrate SUB. In FIG. 4, a location of the substrate SUB is illustrated by way of example for better understanding of the structure of the memory block BLK.

An example is illustrated in FIG. 4 in which the common source line CSL is connected with lower ends (or lower portions) of the cell strings CS. However, it is sufficient if the common source line CSL is electrically connected with the lower ends of the cell strings CS, and the present disclosure is not limited to the case that the common source line CSL is physically located at the lower ends of the cell strings CS. An example is illustrated in FIG. 4 in which the cell strings CS are arranged in a 4×4 matrix. However, the number of cell strings CS in the memory block BLK may increase or decrease.

The cell strings CS of each row may be connected in common with the ground selection line GSL (e.g., GSL1~GSL4) and may be connected with a corresponding string selection line of first to fourth string selection lines SSL1 to SSL4. Cell strings of each column may be connected with a corresponding one of first to fourth bit lines BL1 to BL4. To prevent a drawing from being complicated, the cell strings CS connected with the second and third string selection lines SSL2 and SSL3 are depicted to be blurred.

Each cell string CS may include at least one ground selection transistor GST connected with the ground selection line GSL, a plurality of memory cells MC1 to MC8 respectively connected with a plurality of word lines WL1 to WL8, and string selection transistors SST respectively connected with the string selection lines SSL (e.g., SSL1, SSL2, SSL3, or SSL4).

In each cell string CS, the ground selection transistor GST, the memory cells MC1 to MC8, and the string selection transistors SST may be connected in series in a direction perpendicular to the substrate SUB and may be sequentially stacked in the direction perpendicular to the substrate SUB. In each cell string CS, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8.

In an embodiment, memory cells that are placed at the same height and are associated with the string selection lines SSL1, SSL2, SSL3, or SSL4 may form one physical page. Memory cells of one physical page may be connected with one sub-word line. Sub-word lines of physical pages placed at the same height may be connected in common with one word line.

In an embodiment, sub-word lines of physical pages positioned at the same height may be connected with each other at a height at which the sub-word lines are formed. For another example, sub-word lines of physical pages positioned at the same height may be indirectly connected with each other in any other layer, which has a height different from a height at which the sub-word lines are formed, such as a metal layer.

Figure 5:
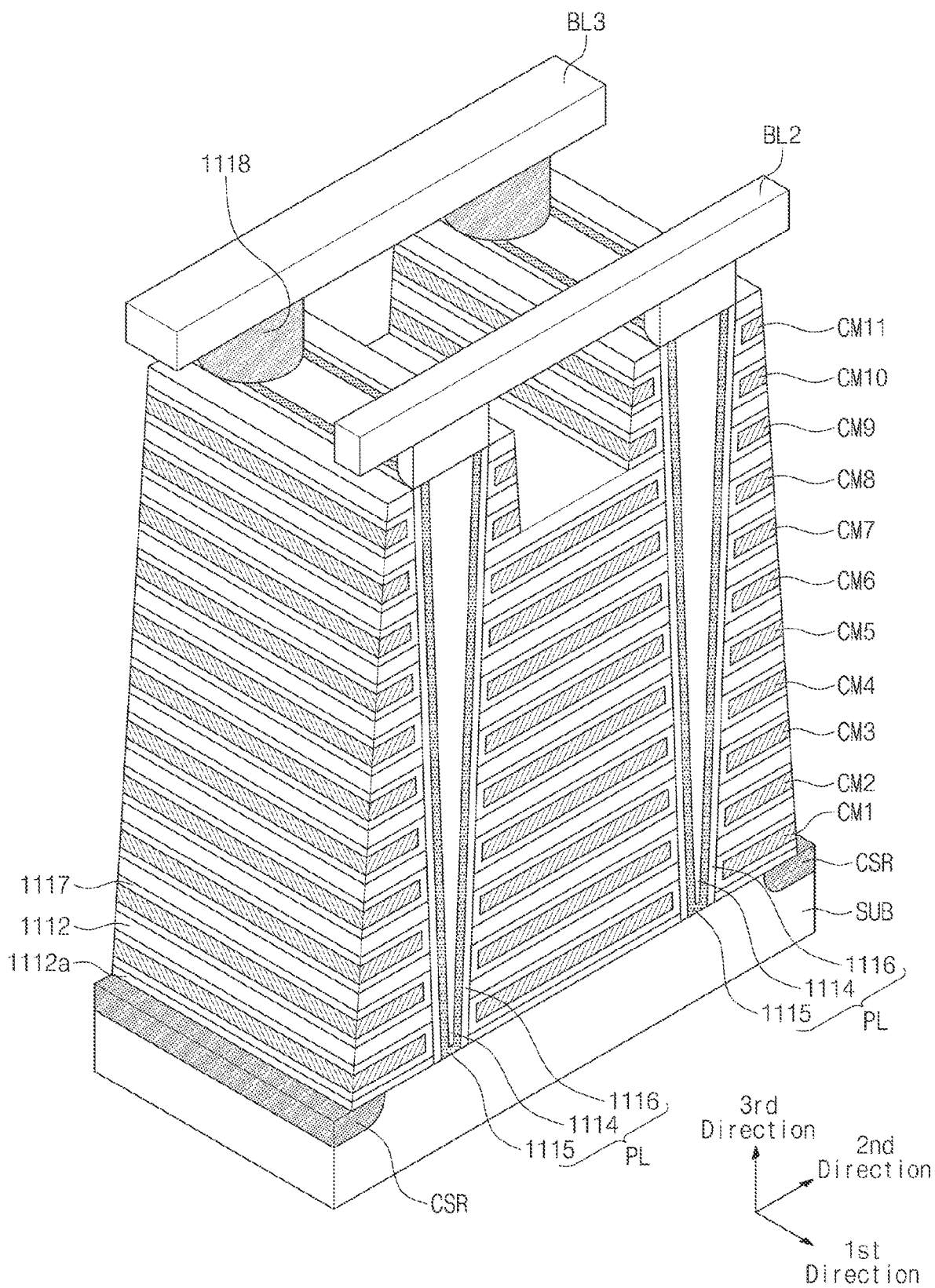
FIG. 5 is a perspective view illustrating a partial structure of a memory block of FIG. 4.

FIG. 5 is a perspective view illustrating a partial structure of the memory block BLK of FIG. 4. Referring to FIGS. 4 and 5, common source regions CSR that extend in a first direction and are spaced from each other in a second direction are provided on the substrate SUB.

The common source regions CSR may be connected in common to form the common source line CSL. In an embodiment, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 1112 and 1112a are sequentially stacked on the substrate SUB in a third direction perpendicular to the substrate SUB. The insulating layers 1112 and 1112a may be spaced from each other in the third direction. In an embodiment, the insulating layers 1112 and 1112a may include silicon oxide or silicon nitride. In an embodiment, a thickness of the insulating layer 1112a (e.g., a thickness in the third direction), which is in contact with the substrate SUB, from among the insulating layers 1112 and 1112a may be thinner than a thickness of each of the remaining insulating layers 1112 (e.g., a thicknesses in the third direction).

Pillars PL that are spaced from each other in the first direction and the second direction and penetrate the insulating layers 1112 and 1112a in the third direction are provided between the common source regions CSR. In an embodiment, the pillars PL may be in contact with the substrate SUB through the insulating layers 1112 and 1112a. Each of the pillars PL may include an inner material 1114, a channel layer 1115, and a first insulating layer 1116.

The inner material 1114 may include an insulating material or an air gap. The channel layer 1115 may include a P-type semiconductor material or an intrinsic semiconductor material. The first insulating layer 1116 may include one or more of insulating layers (e.g., different insulating layers) such as a silicon oxide layer, a silicon nitride layer, and an aluminum oxide layer.

Between the common source regions CSR, second insulating layers 1117 are provided on upper surfaces and lower surfaces of the insulating layers 1112 and 1112a and exposed outer surfaces of the pillars PL. There may be removed the second insulating layers 1117 provided on an upper surface of an insulating layer placed at the highest height from among the insulating layers 1112 and 1112a.

In each of the pillars PL, the first insulating layer 1116 and the second insulating layer 1117, when coupled adjacent to each other, may form an information storage layer. For example, the first insulating layer 1116 and the second insulating layer 1117 may include oxide-nitride-oxide (ONO) or oxide-nitride-aluminum (ONA). The first insulating layer 1116 and the second insulating layer 1117 may form a tunneling insulating layer, a charge trap layer, and a blocking insulating layer.

Between the common source regions CSR and between the insulating layers 1112 and 1112a, conductive materials CM1 to CM11 are provided on exposed outer surfaces of the second insulating layers 1117. The conductive materials CM1 to CM11 may include a metallic conductive material. Drains 1118 are provided on the pillars PL. In an embodiment, the drains 1118 may include an N-type semiconductor material (e.g., silicon). In an embodiment, the drains 1118 may be in contact with upper surfaces of the channel layers 1115 of the pillars PL.

The bit lines BL2 and BL3 that extend in the second direction and are spaced from each other in the first direction are provided on the drains 1118. The bit lines BL2 and BL3 are connected with the drains 1118. In an embodiment, the drains 1118 and the bit lines (e.g., BL2 and BL3) may be connected through contact plugs. The bit lines BL2 and BL3 may include a metallic conductive material.

The pillars PL form the cell strings CS together with the first and second insulating layers 1116 and 1117 and the conductive materials CM1 to CM11. The pillars PL form cell strings together with the first and second insulating layers 1116 and 1117 and the conductive materials CM1 to CM11 adjacent thereto. The first conductive material CM1 may form the ground selection transistors GST together with the first and second insulating layers 1116 and 1117 and the channel layers 1115 adjacent thereto. The first conductive material CM1 may extend in the first direction to form the ground selection line GSL.

The second to ninth conductive materials CM2 to CM9 may form first to eighth memory cells MC1 to MC8 together with the first and second insulating layers 1116 and 1117 and the channel layers 1115 adjacent thereto. The second to ninth conductive materials CM2 to CM9 may extend in the first direction to form first to eighth word lines WL1 to WL8, respectively.

The tenth conductive materials CM10 may form lower string selection transistors close to the substrate SUB from among the string selection transistors SST together with the first and second insulating layers 1116 and 1117 and the channel layers 1115 adjacent thereto. The tenth conductive materials CM10 may extend in the first direction to form lower string selection lines close to the substrate SUB from among the string selection lines SSL1 to SSL4.

The eleventh conductive materials CM11 may form upper string selection transistors adjacent to the bit lines BL1 to BL4 from among the string selection transistors SST together with the first and second insulating layers 1116 and 1117 and the channel layers 1115 adjacent thereto. The eleventh conductive materials CM11 may extend in the first direction to form upper string selection lines close to the bit lines BL1 to BL4 from among the string selection lines SSL1 to SSL4.

The memory block BLK may be provided at a three-dimensional (3D) memory array. The 3D memory array is monolithically formed in one or more physical levels of arrays of memory cells MC having an active area disposed above a silicon substrate and circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

An embodiment is illustrated in FIG. 5 in which the common source region CSR is provided as a portion of the substrate SUB, but the common source region CSR may be provided in the form of a plate covering the substrate SUB.

Figure 6:
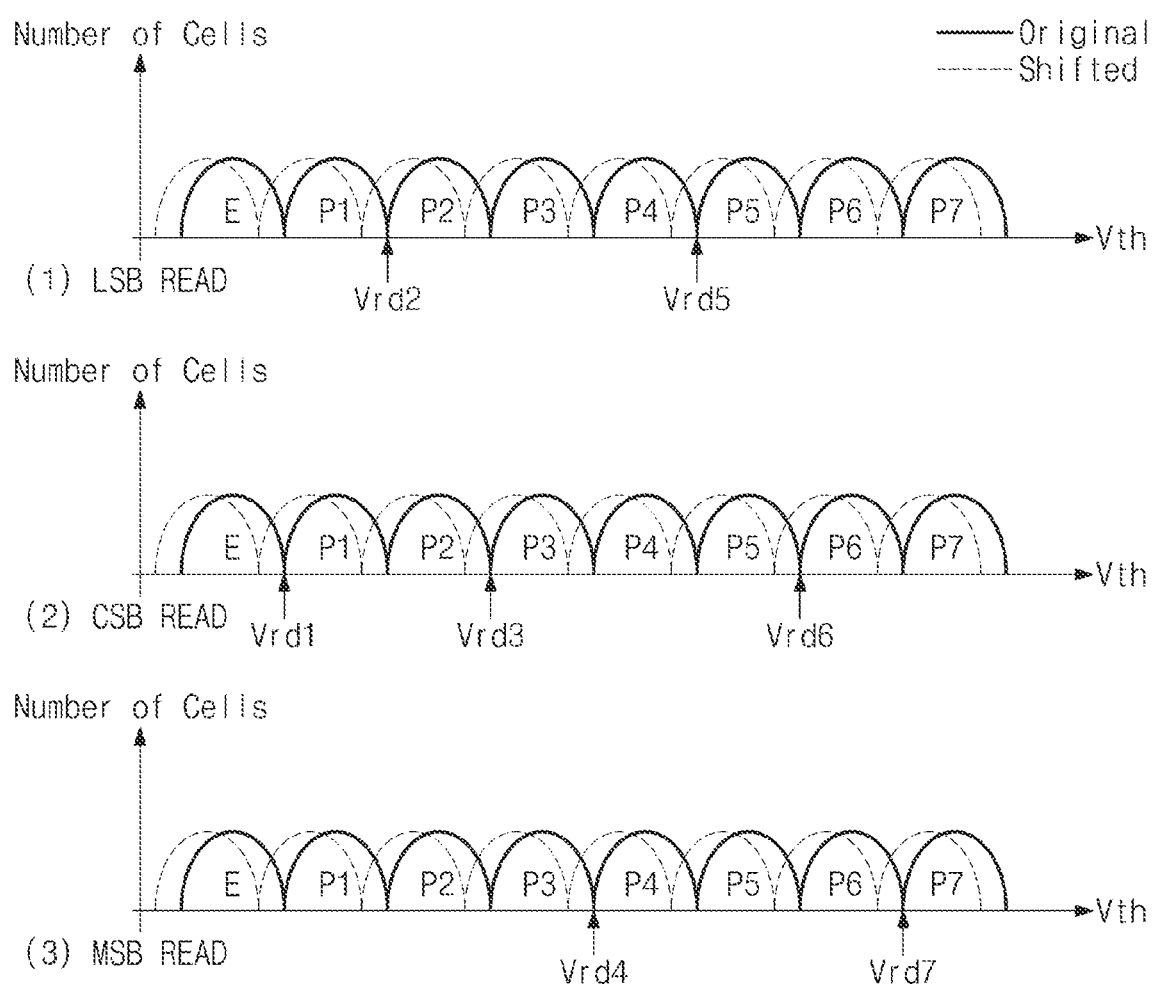
FIG. 6 is a distribution diagram illustrating original program threshold voltage distributions of memory cells and threshold voltage distributions changed over time.

FIG. 6 is a distribution diagram illustrating original program threshold voltage distributions of memory cells and threshold voltage distributions changed over time. Referring to FIG. 6, there may be disclosed a read method for each page of a triple level cell (TLC) capable of storing 3-bit data.

Below, the description will be given with reference to FIGS. 1, 3, and 6. In FIG. 6, a solid line indicates original threshold voltage distributions of memory cells. A dotted line indicates threshold voltage distributions shifted over time. As illustrated in FIG. 6, threshold voltage distributions may be shifted in a direction where a threshold voltage decreases.

The nonvolatile memory device 120 may determine program states of programmed memory cells by using first to seventh read voltages Vrd1 to Vrd7. In an embodiment, the first to seventh read voltages Vrd1 to Vrd7 may be generated by the control logic circuit 126. The first to seventh read voltages Vrd1 to Vrd7 may have given voltage levels for the purpose of determining program states of programmed memory cells.

The second and fifth read voltages Vrd2 and Vrd5 may be sequentially applied to a selected word line to read a least significant bit (LSB) page. In an embodiment, the second read voltage Vrd2 may be used to distinguish a state having a threshold voltage equal to or smaller than a first program state P1 and a state having a threshold voltage equal to or greater than a second program state P2. The fifth read voltage Vrd5 may be used to distinguish a state having a threshold voltage equal to or smaller than a fourth program state P4 and a state having a memory cell equal to or greater than a fifth program state P5.

The first, third, and sixth read voltages Vrd1, Vrd3, and Vrd6 may be sequentially applied to the selected word line to read a center significant bit (CSB) page. In an embodiment, the first read voltage Vrd1 may be used to distinguish a state having a threshold voltage equal to or smaller than an erase state "E" and a state having a threshold voltage equal to or greater than the first program state P1. The third read voltage Vrd3 may be used to distinguish a state having a threshold voltage equal to or smaller than the second program state P2 and a state having a memory cell equal to or greater than a third program state P3. The sixth read voltage Vrd6 may be used to distinguish a state having a threshold voltage equal to or smaller than the fifth program state P5 and a state having a memory cell equal to or greater than a sixth program state P6.

The fourth and seventh read voltages Vrd4 and Vrd7 may be sequentially applied to the selected word line to read a most significant bit (MSB) page. In an embodiment, the fourth read voltage Vrd4 may be used to distinguish a state having a threshold voltage equal to or smaller than the third program state P3 and a state having a threshold voltage equal to or greater than the fourth program state P4. The seventh read voltage Vrd7 may be used to distinguish a state having a threshold voltage equal to or smaller than the sixth program state P6 and a state having a memory cell equal to or greater than a seventh program state P7.

In an embodiment, the plurality of read voltages Vrd1 to Vrd7 of the nonvolatile memory device 120 are determined based on stabilized threshold voltage distributions (e.g., threshold voltage distributions after a given time passes). However, as illustrated in FIG. 6, threshold voltage distributions of the erase and program states "E" and P1 to P7 may be shifted over time. Threshold voltage distributions may be shifted in a direction where a threshold voltage decreases.

For example, in the case where a memory cell is programmed and is then left alone for a long time, charges trapped in a charge trap layer may be de-trapped or lost. As such, a threshold voltage of the memory cell may decrease.

Accordingly, in the case of reading programmed memory cells by using the plurality of read voltages Vrd1 to Vrd7, the nonvolatile memory device 120 may read data including an error. To prevent data including an error from being read out, the nonvolatile memory device 120 may apply voltages to a plurality of word lines. As such, charges may be again trapped in the charge trap layer, and thus, a threshold voltage may increase.

The nonvolatile memory device 120 may perform a dummy read operation such that a voltage is applied to a plurality of word lines. For example, the nonvolatile memory device 120 may apply the plurality of read voltages Vrd1 to Vrd7 to a selected word line of a selected memory block. The nonvolatile memory device 120 may apply a read pass voltage to unselected word lines of the selected memory block. As such, charges may be again trapped in the charge trap layer, and thus, a threshold voltage may increase. That is, a threshold value decreased due to charge loss may again increase through the dummy read operation.

The nonvolatile memory device 120 of the present disclosure may perform the cure operation such that a voltage is applied to a plurality of word lines. The nonvolatile memory device 120 may apply the cure voltage to the plurality of word lines in response to the cure command CMD_CURE. As such, the nonvolatile memory device 120 may prevent a threshold voltage from decreasing over time. Accordingly, the nonvolatile memory device 120 may read data that do not include an error.

Figure 7:
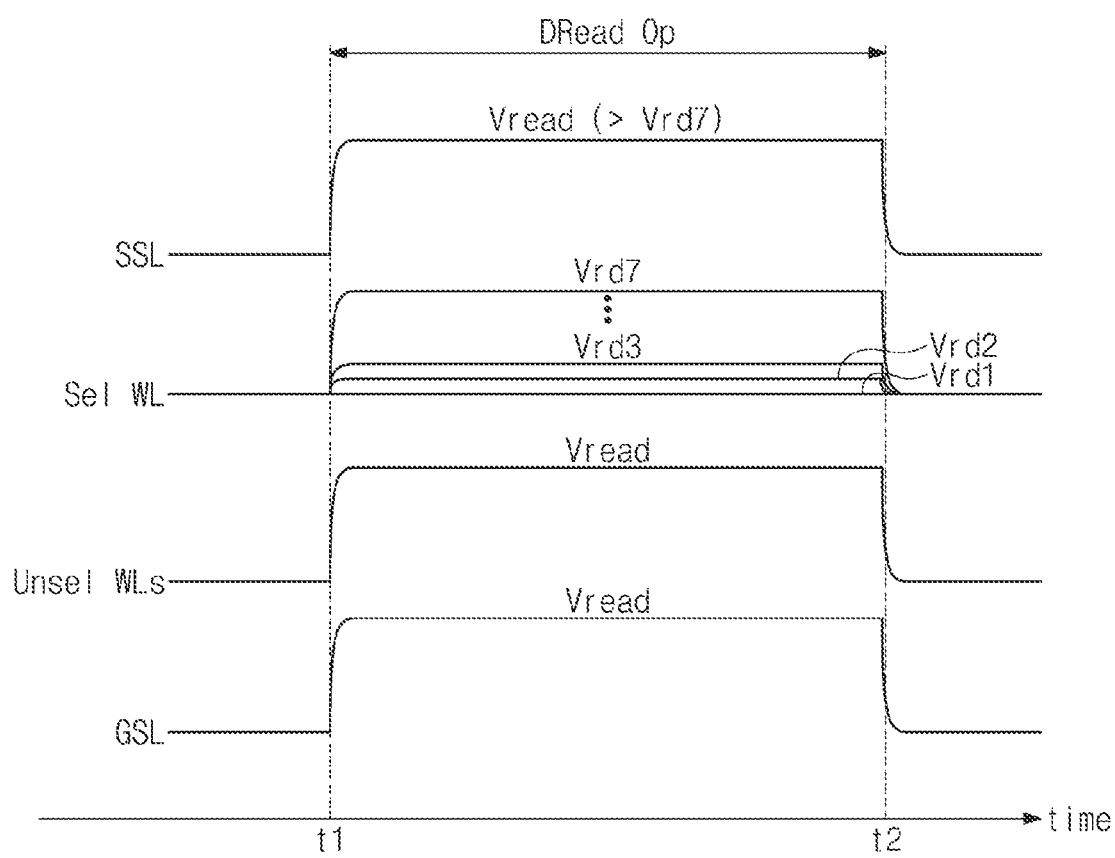
FIGS. 7 and 8 are timing diagrams illustrating examples in which voltages are applied to a cell string of FIG. 4.
Figure 8:
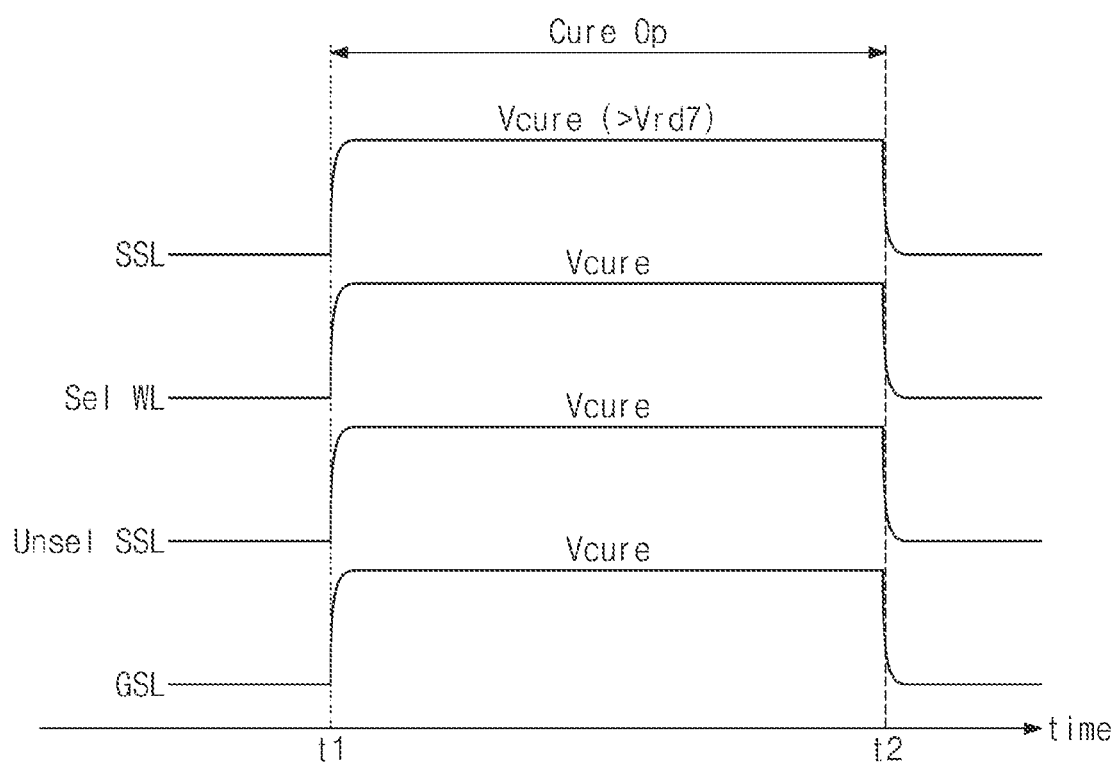

FIGS. 7 and 8 are timing diagrams illustrating examples in which voltages are applied to a cell string of FIG. 4. Voltages that are applied in the dummy read operation DRead Op will be described with reference to FIG. 7, and voltages that are applied in the cure operation Cure Op will be described with reference to FIG. 8.

A selected word line Sel WL indicates a word line, which is connected with a cell transistor targeted for reading, from among a plurality of word lines. Unselected word lines Unsel WLs indicate the remaining word lines of the plurality of word lines other than the selected word line.

Referring to FIGS. 4, 6, and 7, at a first time t1, a read pass voltage Vread may be applied to the string selection line SSL. The read pass voltage Vread may be applied to the unselected word lines Unsel WLs. The read pass voltage Vread may be applied to the ground selection line GSL. One of the first to seventh read voltages Vrd1 to Vrd7 may be applied to the selected word line Sel WL. The read pass voltage Vread may be greater than the seventh read voltage Vrd7.

At a second time t2, a turn-off voltage may be applied to the string selection line SSL. The turn-off voltage may be applied to the selected word line Sel WL. The turn-off voltage may be applied to the unselected word lines Unsel WLs. The turn-off voltage may be applied to the ground selection line GSL. In an embodiment, the turn-off voltage may be a ground voltage or a negative voltage.

As described above, in the dummy read operation DRead Op associated with any page of a selected memory block, the nonvolatile memory device 120 may apply one of the first to seventh read voltages Vrd1 to Vrd7 to a selected word line and may apply the read pass voltage Vread to unselected word lines. As such, the nonvolatile memory device 120 may prevent a threshold voltage from decreasing.

The nonvolatile memory device 120 may perform the dummy read operation DRead Op on a selected memory block. In contrast, the nonvolatile memory device 120 according to an embodiment of the present disclosure may simultaneously perform the cure operation Cure Op on all memory blocks. For comparison with the dummy read operation DRead Op, in FIG. 8, the description will be given with reference to one memory block of a plurality of memory blocks. A selected word line and unselected word lines are not distinguished in the cure operation Cure Op but are illustrated for comparison with the dummy read operation DRead Op.

Referring to FIGS. 4, 6, and 8, at a first time t1, a cure voltage Vcure may be applied to the string selection line SSL. The cure voltage Vcure may be applied to a selected word line Sel WL. The cure voltage Vcure may be applied to unselected word lines Unsel WLs. The cure voltage Vcure may be applied to the ground selection line GSL. In an embodiment, the cure voltage Vcure may be greater than the seventh read voltage Vrd7. The cure voltage Vcure may be a voltage sufficient to turn on all memory cells. In an embodiment, the cure voltage Vcure may be the read pass voltage Vread.

At a second time t2, the turn-off voltage may be applied to the string selection line SSL. The turn-off voltage may be applied to the selected word line Sel WL. The turn-off voltage may be applied to the unselected word lines Unsel WLs. The turn-off voltage may be applied to the ground selection line GSL. In an embodiment, the turn-off voltage may be a ground voltage or a negative voltage.

As described above, through the cure operation Cure Op, the nonvolatile memory device 120 may apply the cure voltage Vcure to a selected word line and unselected word lines. As such, the nonvolatile memory device 120 may prevent a threshold voltage from decreasing.

In the dummy read operation DRead Op, the nonvolatile memory device 120 may apply one of the first to seventh read voltages Vrd1 to Vrd7 to a selected word line. In contrast, in the cure operation Cure Op, the nonvolatile memory device 120 may apply the cure voltage Vcure to a selected word line like unselected word lines. That is, in the cure operation Cure Op, the nonvolatile memory device 120 may apply the cure voltage Vcure to all word lines.

Figure 9:
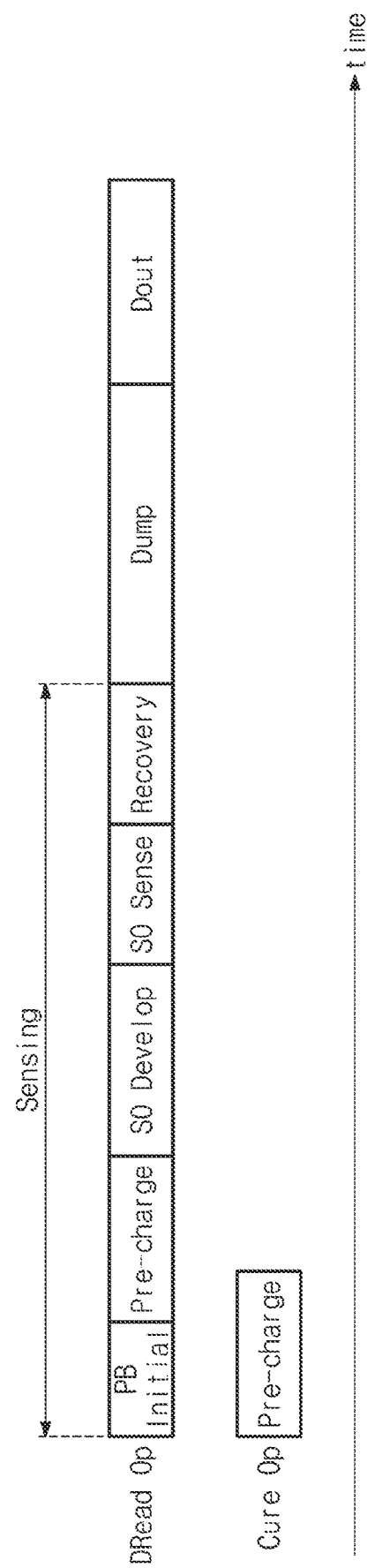
FIG. 9 is a diagram illustrating a difference between a cure operation and a read operation.

FIG. 9 is a diagram illustrating a difference between a cure operation and a read operation. Referring to FIGS. 3 and 9, the nonvolatile memory device 120 may perform the dummy read operation DRead Op in the same manner as a read operation. In the dummy read operation DRead Op, the nonvolatile memory device 120 may receive the read command CMD_RD and the address ADDR from the memory controller 110 and may output the data DT to the memory controller 110. However, the memory controller 110 may not send the data DT received from the nonvolatile memory device 120 to a host (not illustrated).

The dummy read operation DRead Op may include a sensing operation Sensing, a dumping operation Dump, and a data output operation Dout. For example, the nonvolatile memory device 120 may perform the sensing operation Sensing at the page buffer circuit 124. Next, the nonvolatile memory device 120 may perform the dumping operation Dump to send data from the page buffer circuit 124 to the input/output circuit 125. Then, the nonvolatile memory device 120 may perform the data output operation Dout to output data from the input/output circuit 125 to the data lines DQ.

The sensing operation Sensing may include a page buffer initialization phase PB Initial, a pre-charge phase Pre-charge, a sensing node develop phase SO Develop, a sensing node sensing phase SO Sense, and a recovery phase Recovery. In the page buffer initialization phase PB Initial, the nonvolatile memory device 120 may initialize a page buffer. In the pre-charge phase Pre-charge, the nonvolatile memory device 120 may apply a pre-charge voltage to a bit line BL. In the sensing node develop phase SO Develop, the nonvolatile memory device 120 may connect a sensing node with the bit line BL by using a bit line voltage control signal. A voltage of the sensing node may change depending on a potential of the bit line BL. In the sensing node sensing phase SO Sense, sensing data corresponding to the potential of the sensing node may be stored in the page buffer of the nonvolatile memory device 120. In the recovery phase Recovery, the nonvolatile memory device 120 may discharge voltages of transistors maintained in previous phases.

The cure operation Cure Op may include a pre-charge phase Pre-charge. In the pre-charge phase Pre-charge, the nonvolatile memory device 120 may apply the cure voltage Vcure to a string selection line, word lines, and a ground selection line. As such, compared to the dummy read operation DRead Op, when performing the cure operation Cure Op, the nonvolatile memory device 120 may omit the page buffer initialization phase PB Initial, the sensing node develop phase SO Develop, the sensing node sensing phase SO Sense, and the recovery phase Recovery of the sensing operation Sensing and may omit the dumping operation Dump and the data output operation Dout.

That is, a conventional nonvolatile memory device may apply voltages to a plurality of word lines through the dummy read operation DRead Op. However, the conventional nonvolatile memory device may unnecessarily perform the following phases of the sensing operation Sensing, as well as the dumping operation Dump and the data output operation Dout: the page buffer initialization phase PB Initial, the sensing node develop phase SO Develop, the sensing node sensing phase SO Sense, and the recovery phase Recovery. In contrast, the nonvolatile memory device 120 according to an embodiment of the present disclosure may not perform unnecessary operations and may apply the cure voltage Vcure to a plurality of word lines.

In an embodiment, the cure operation Cure Op may include the sensing operation Sensing and the dumping operation Dump of the dummy read operation DRead Op. That is, in performing the cure operation Cure Op, the nonvolatile memory device 120 may identically perform the remaining operations of the read operation other than the data output operation Dout. Alternatively, the cure operation Cure Op may only include the sensing operation Sensing of the dummy read operation DRead Op. That is, in performing the cure operation Cure Op, the nonvolatile memory device 120 may perform the page buffer initialization phase PB Initial, the pre-charge phase Pre-charge, the sensing node develop phase SO Develop, the sensing node sensing phase SO Sense, and the recovery phase Recovery.

In an embodiment, the nonvolatile memory device 120 may perform a verification operation or any other cure operation together by using the cure operation Cure Op. For example, the nonvolatile memory device 120 may perform the cure operation Cure Op in which the cure voltage Vcure is applied to a plurality of word lines, a ground selection line, and a string selection line.

The nonvolatile memory device 120 may sense bit lines of a memory block to which the cure voltage Vcure is applied. The nonvolatile memory device 120 may store a sensing result in a register. Afterwards, the nonvolatile memory device 120 may provide the sensing result to the memory controller 110 through a register read operation. The memory controller 110 may determine a bad block, based on the sensing result. As such, based on the sensing result obtained through the cure operation Cure Op, the memory controller 110 may determine a bad block or may perform any other verification/cure operation.

Figure 10:
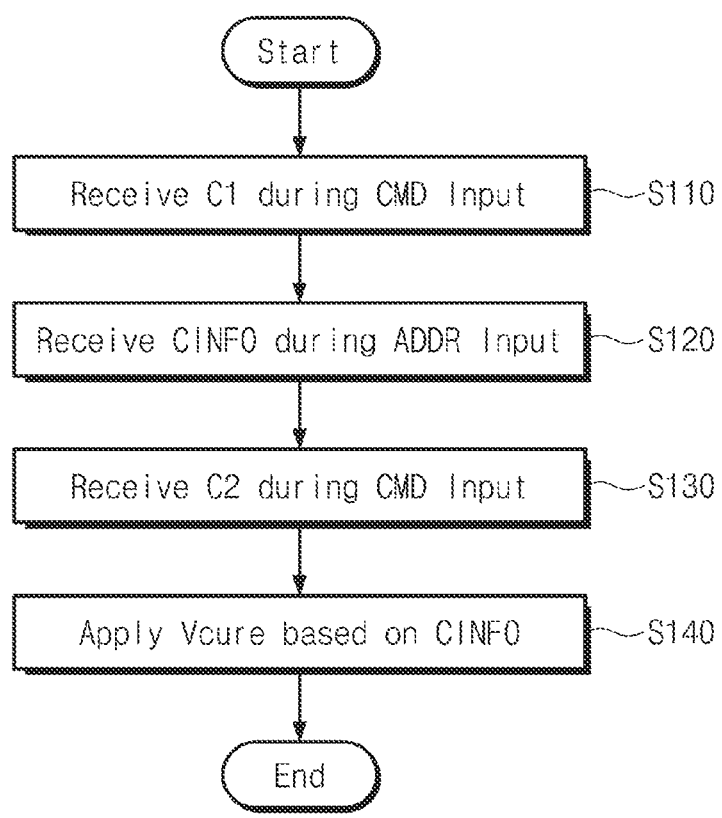
FIG. 10 is a flowchart illustrating an operation of a nonvolatile memory device of FIG. 1.
Figure 11:
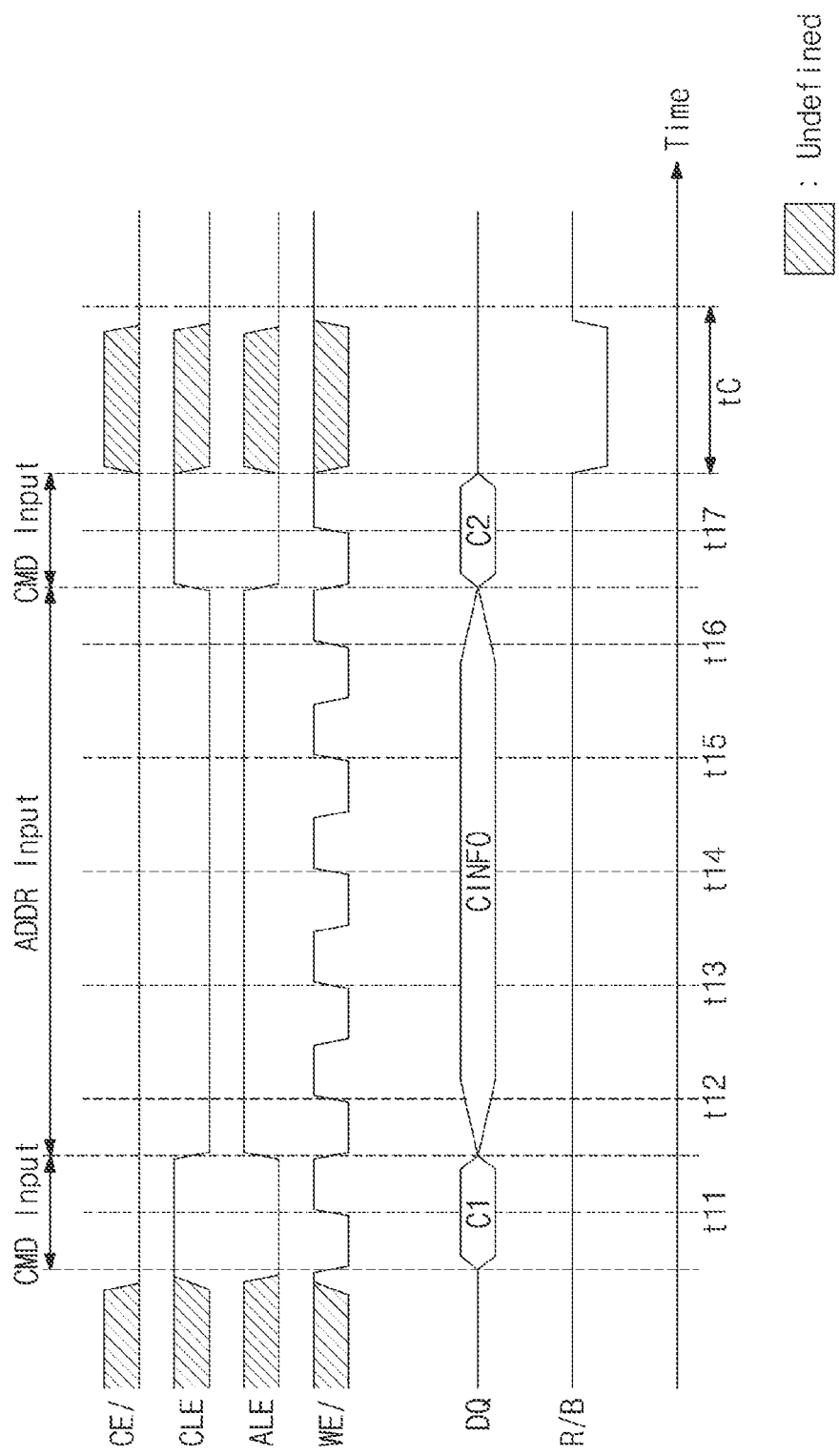
FIG. 11 is a timing diagram illustrating an operation of a nonvolatile memory device.

FIG. 10 is a flowchart illustrating an operation of a nonvolatile memory device of FIG. 1. FIG. 11 is a timing diagram illustrating an operation of a nonvolatile memory device. The cure operation of the nonvolatile memory device 120 will be described with reference to FIGS. 10 and 11.

Referring to FIGS. 1, 10, and 11, in operation S110, the nonvolatile memory device 120 may receive a first cure command C1 during a command input period CMD Input. For example, at t11, the nonvolatile memory device 120 may latch signals received through the data lines DQ as the first cure command C1 in synchronization with a rising edge of the write enable signal WE/.

In operation S120, the nonvolatile memory device 120 may receive the cure information CINFO during an address input period ADDR Input. For example, from t12 to t16, the nonvolatile memory device 120 may latch signals received through the data lines DQ as the cure information CINFO in synchronization with rising edges of the write enable signal WE/. The cure information CINFO will be more fully described with reference to the following drawings.

In an embodiment, the cure information CINFO may be received during some periods (e.g., 5 periods) of the write enable signal WE/. However, the present disclosure is not limited thereto. The cure information CINFO may include information about a region where the cure operation is to be performed, information about a level of a cure voltage, or information about a cure time. In various embodiments, the cure information CINFO may be information different from general address information.

In operation S130, the nonvolatile memory device 120 may receive a second cure command C2 during the command input period CMD Input. For example, at t17, the nonvolatile memory device 120 may latch signals received through the data lines DQ as the second cure command C2 in synchronization with a rising edge of the write enable signal WE/. In an embodiment, the first and second cure commands C1 and C2 may be a command set for the cure operation.

In operation S140, the nonvolatile memory device 120 may apply the cure voltage Vcure to all word lines. For example, the nonvolatile memory device 120 may perform the cure operation in response to the second cure command C2. For example, as described above, the nonvolatile memory device 120 may apply the cure voltage Vcure to all the word lines. A level of the cure voltage Vcure may correspond to a level of a read pass voltage that is applied to unselected word lines in the read operation.

In an embodiment, the cure operation may be performed during a time of $t_C$. That is, the nonvolatile memory device 120 may perform the pre-charge phase during the time of $t_C$. In an embodiment, during the time of $t_C$, the nonvolatile memory device 120 may provide the ready/busy signal R/B of logical low (i.e., a busy state) to the memory controller 110.

In an embodiment, the following Table 1 shows control signals in a command input period CMD Input, an address input period ADDR Input, and a data output period DATA Output. While the nonvolatile memory device 120 receives the command CMD or the address ADDR or makes input/output of the data "DATA", the chip enable signals /CE maintains a low level "L".

TABLE 1

|  | CLE | ALE | RE/ | WE/ | DQS |
| --- | --- | --- | --- | --- | --- |
| CMD Input | H | L | H | ↑ | X |
| ADDR Input | L | H | H | ↑ | X |
| DATA Output | L | L | ↓↑ | H | ↓↑ |

Referring to Table 1, in the command input period CMD Input, the command latch enable signal CLE and the read enable signal RE/ are logical high "H" and the address latch enable signal ALE is logical low "L". During the command input period CMD Input, the nonvolatile memory device 120 latches signals received through the data lines DQ as the command CMD at a rising edge (↑) of the write enable signal WE/. In the address input period ADDR Input, the address latch enable signal ALE and the read enable signal RE/ are logical high "H" and the command latch enable signal CLE is logical low "L". During the address input period ADDR Input, the nonvolatile memory device 120 latches signals received through the data lines DQ as the address ADDR or the cure information CINFO at a rising edge (↑) of the write enable signal WE/. In this case, the address ADDR may be information corresponding to a page where read data are stored in the read operation.

In the data output period DATA Output, the command latch enable signal CLE and the address latch enable signal ALE are logical low "L" and the write enable signal WE/ is logical high "H". In the data output period DATA Output, the nonvolatile memory device 120 generates the data strobe signal DQS based on the read enable signal RE/ and outputs the data DT through the data lines DQ in synchronization with a rising edge (↑) and a falling edge (↓) of the data strobe signal DQS. In an embodiment, signal levels disclosed in Table 1 above are an example, and the present disclosure is not limited thereto. However, control signals in the command input period CMD Input, the address input period ADDR Input, and the data output period DATA Output to be described below may follow Table 1 above.

The nonvolatile memory device 120 may prevent a threshold voltage from decreasing through a dummy read operation. For example, the nonvolatile memory device 120 may perform a page read operation, a sequential cache read operation, or a random cache read operation.

In an embodiment, the nonvolatile memory device 120 may perform one page read operation. The nonvolatile memory device 120 may receive a first read command RD1 during the command input period CMD Input. Next, the nonvolatile memory device 120 may receive addresses AD during the address input period ADDR Input. Then, the nonvolatile memory device 120 may receive a second read command RD2 during another command input period CMD Input.

In response to the second read command RD2, the nonvolatile memory device 120 may read the data DT corresponding to the received addresses AD from the memory cell array 122. For example, the nonvolatile memory device 120 may read the data DT corresponding to the received addresses AD from the memory cell array 122 and may prepare the read data DT in the input/output circuit 125. The above data preparation operation may be performed during a time of tR. In an embodiment, during the time of tR, the nonvolatile memory device 120 may provide the ready/busy signal R/B of logical low (i.e., a busy state) to the memory controller 110.

After the data preparation operation is completed, the nonvolatile memory device 120 may generate the data strobe signal DQS in response to the read enable signal RE/ from the memory controller 110 and may output data "D" through the data lines DQ in synchronization with the generated data strobe signal DQS during the data output period DATA Output.

The nonvolatile memory device 120 may perform the sequential cache read operation. For example, the nonvolatile memory device 120 may receive a first cache read command CRD1 during the command input period CMD Input. Next, the nonvolatile memory device 120 may receive a first address AD1 during the address input period ADDR Input. Then, the nonvolatile memory device 120 may receive a second cache read command CRD2 during another command input period CMD Input. During the time of tR, the nonvolatile memory device 120 may read data of a first page corresponding to the first address AD1 as first cache data DT_c1 in response to the second cache read command CRD2.

Then, the nonvolatile memory device 120 may receive a third cache read command CRD3 during another command input period CMD Input. During a time of tDCBSYR, the nonvolatile memory device 120 may prepare the first cache data DT_c1 previously read, in response to the third cache read command CRD3.

After the time of tDCBSYR, the nonvolatile memory device 120 may output the first cache data DT_c1 through the data lines DQ. During the output of the first cache data DT_c1, the nonvolatile memory device 120 may read data of a second page different from the first page, as second cache data DT_c2.

Next, the nonvolatile memory device 120 may further receive the third cache read command CRD3 during another command input period CMD Input. During the time of tDCBSYR, the nonvolatile memory device 120 may prepare the second cache data DT_c2 previously read, in response to the third cache read command CRD3 and may output the second cache data DT_c2 through the data lines DQ. During the output of the second cache data DT_c2, the nonvolatile memory device 120 may read data of another page, for example, a third page, as third cache data DT_c3.

Afterwards, the nonvolatile memory device 120 may receive a fourth cache read command CRD4 during another command input period CMD Input, may prepare the third cache data DT_c3 in response to the fourth cache read command CRD4, and may output the third cache data DT_c3 thus prepared through the data lines DQ. In an embodiment, each of the first to third cache data DT_c1 to DT_c3 may be single page data.

The nonvolatile memory device 120 may perform the random cache read operation. For example, the nonvolatile memory device 120 may sequentially receive the first cache read command CRD1, the first address AD1, and the second cache read command CRD2. Next, during the time of tR, the nonvolatile memory device 120 may read data of a page corresponding to the first address AD1 as the first cache data DT_c1.

Then, the nonvolatile memory device 120 may sequentially receive the first cache read command CRD1, a second address AD2, and the third cache read command CRD3. In response to the third cache read command CRD3, the nonvolatile memory device 120 may prepare the first cache data DT_c1 previously read, during the time of tDCBSYR and may output the first cache data DT_c1 through the data lines DQ. During the output of the first cache data DT_c1, the nonvolatile memory device 120 may read data of a page corresponding to the second address AD2, as the second cache data DT_c2.

Then, the nonvolatile memory device 120 may sequentially receive the first cache read command CRD1, a third address AD3, and the third cache read command CRD3. In response to the third cache read command CRD3, the nonvolatile memory device 120 may prepare the second cache data DT_c2 previously read, during the time of tDCBSYR and may output the second cache data DT_c2 through the data lines DQ. During the output of the second cache data DT_c2, the nonvolatile memory device 120 may read data of a page corresponding to the third address AD3, as the third cache data DT_c3.

Afterwards, the nonvolatile memory device 120 may receive the fourth cache read command CRD4, may prepare the third cache data DT_c3 previously read, in response to the fourth cache read command CRD4, and may output the third cache data DT_c3 thus prepared, through the data lines DQ.

As described above, the nonvolatile memory device 120 may perform the page read operation, the sequential cache read operation, or the random cache read operation. Through the above operation, the nonvolatile memory device 120 may apply a voltage to a plurality of word lines to prevent a threshold voltage from decreasing. However, the dummy read operation further requires a data output period compared to the cure operation. In contrast, the data output period may be omitted in the cure operation. That is, through the cure operation, the nonvolatile memory device 120 may prevent a threshold voltage from decreasing without performing an unnecessary data output operation.

Figure 12:
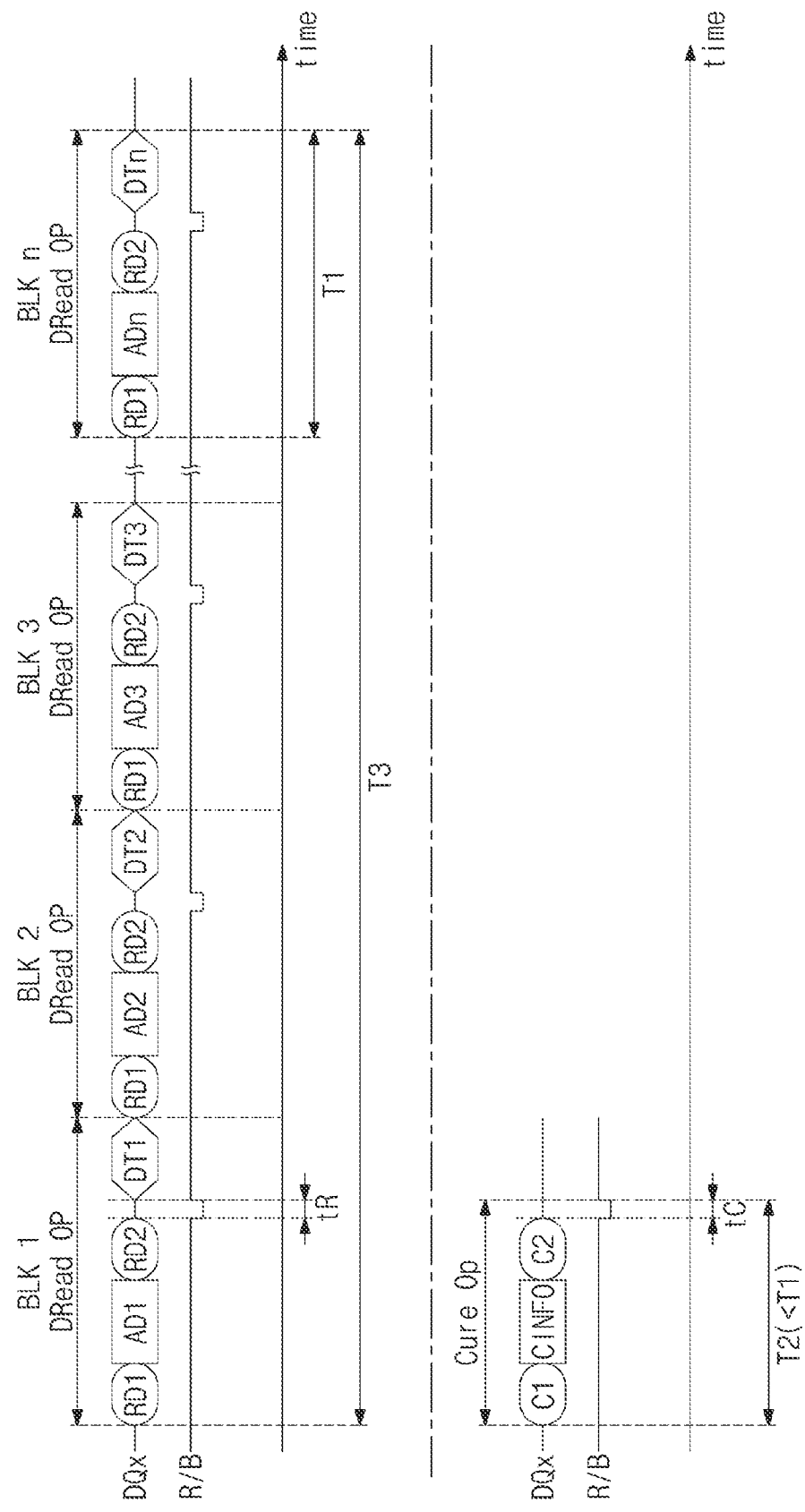
FIG. 12 is a timing diagram illustrating an operation of a memory controller.

FIG. 12 is a timing diagram illustrating an operation of a memory controller. Referring to FIGS. 1 and 12, to prevent a decrease in a threshold voltage, the memory controller 110 may perform the dummy read operation on first to n-th memory blocks BLK1 to BLKn (n being a positive number). For example, the memory controller 110 may perform a dummy read operation BLK1 DRead Op on the first memory block BLK1. The memory controller 110 may send the first read command RD1 during the command input period CMD Input.

Next, the memory controller 110 may send the first address AD1 during the address input period ADDR Input. For example, the first address AD1 may be an address associated with one of a plurality of pages of the first memory block BLK1.

Then, the memory controller 110 may send the second read command RD2 during the command input period CMD Input. During the time of tR, the nonvolatile memory device 120 may read data of a first page corresponding to the first address AD1 as first data DT1 in response to the second read command RD2.

Afterwards, the memory controller 110 may perform a dummy read operation BLK2 DRead Op on the second memory block BLK2. The memory controller 110 may send the first read command RD1 during the command input period CMD Input.

Next, the memory controller 110 may send the second address AD2 during the address input period ADDR Input. For example, the second address AD2 may be an address associated with one of a plurality of pages of the second memory block BLK2.

Then, the memory controller 110 may send the second read command RD2 during the command input period CMD Input. During the time of tR, the nonvolatile memory device 120 may read data of a second page corresponding to the second address AD2 as second data DT2 in response to the second read command RD2.

Afterwards, the memory controller 110 may perform a dummy read operation BLK3 DRead Op on the third memory block BLK3. The memory controller 110 may send the first read command RD1 during the command input period CMD Input.

Next, the memory controller 110 may send the third address AD3 during the address input period ADDR Input. For example, the third address AD3 may be an address associated with one of a plurality of pages of the third memory block BLK3.

Then, the memory controller 110 may send the second read command RD2 during the command input period CMD Input. During the time of tR, the nonvolatile memory device 120 may read data of a third page corresponding to the third address AD3 as third data DT3 in response to the second read command RD2.

Afterwards, as in the above description, the memory controller 110 may perform dummy read operations DRead Op on the fourth to n-th memory blocks BLK4 to BLKn. This is described above, and thus, additional description will be omitted to avoid redundancy. As such, the memory controller 110 may apply a voltage to all word lines by performing the dummy read operation DRead Op on the first to n-th memory blocks BLK1 to BLKn.

The memory controller 110 according to an embodiment of the present disclosure may perform the cure operation Cure Op. The memory controller 110 may send the first cure command C1 during the command input period CMD Input. Next, the memory controller 110 may send the cure information CINFO during the address input period ADDR Input. Then, the memory controller 110 may send the second cure command C2 during the command input period CMD Input. The nonvolatile memory device 120 may apply the cure voltage Vcure to a plurality of word lines in response to the second cure command C2 during the time of tC.

As illustrated in FIG. 12, a first time T1, that is, a time taken to perform the dummy read operation may correspond to a sum of times taken to perform, at the very least, the operations of the command input period CMD Input, the address input period ADDR Input, the command input period CMD Input, the data preparation period tR, and the data output period DATA Output. To prevent a decrease in a threshold voltage, the memory controller 110 may perform the dummy read operation on all memory blocks. That is, to apply a voltage to all word lines, the memory controller 110 may consume a third time T3, that is, a time corresponding to a product of the first time T1 and the number "n" of memory blocks at the very least.

In contrast, a second time T2, that is, a time taken to perform the cure operation may correspond to a sum of the time of tC and times taken to perform, at the very least, the operations of the command input period CMD Input, the address input period ADDR Input, and the command input period CMD Input. That is, to apply a voltage to all word lines, the memory controller 110 may consume a second time T2 through the cure operation. In an embodiment, the second time T2 may be shorter than the first time T1.

Through the cure operation, the memory controller 110 may apply the cure voltage Vcure to all word lines within a time shorter than that of the dummy read operation. Because the cure operation does not include a data output period, the second time T2 may be shorter than the first time T1. In addition, the memory controller 110 may apply the cure voltage Vcure to all the word lines through one cure command. In another embodiment, the memory controller 110 may apply the cure voltage Vcure to all the word lines through read commands, the number of which corresponds to the number of memory blocks. That is, the second time T2 may be shorter than the third time T3.

As described above, the memory controller 110 may prevent a threshold voltage from decreasing through the dummy read operation. However, during the dummy read operation, the memory controller 110 may fail to perform another read or write operation, thereby causing the reduction of performance That is, iterative dummy read operations may cause the reduction of performance. In contrast, because the cure voltage Vcure is applied to all the word lines within a short time through a cure command, the memory controller 110 with improved performance is provided.

FIG. 13 is a diagram illustrating cure information. Referring to FIGS. 1 and 13, the cure information CINFO may be received through a plurality of cycles (e.g., 5 cycles) of the write enable signal WE/ during the address input period ADDR Input. In an embodiment, the cure information CINFO may include information about a region where the cure operation is to be performed, information about a level of a cure voltage, and information about a cure time. The information about a region where the cure operation is to be performed may include information about a plane, information about a start block address, and information about the number of blocks.

For example, in the address input period ADDR Input, the write enable signal WE/ may toggle as much as a plurality of cycles (e.g., m times, m being an integer greater than 1). Various information (e.g., information about a plane, information about a start block address, and information about the number of blocks, information about a level of a cure voltage, and information about a cure time) included in the cure information CINFO may be sequentially provided to the nonvolatile memory device 120 in synchronization with rising edges of the write enable signal WE/ toggling during a plurality of cycles. The cure information CINFO may be referred to as a "parameter".

In an embodiment, in a first cycle Cycle1, information about a plane may be provided to the nonvolatile memory device 120 through the data lines DQ. For example, it is assumed that the nonvolatile memory device 120 includes first to fourth planes PL1 to PL4. However, the present disclosure is not limited thereto. For example, the number of planes may be changed. The plane information may include first to fourth cure plane bits CP1 to CP4.

The first cure plane bit CP1 may correspond to the first plane PL1, the second cure plane bit CP2 may correspond to the second plane PL2, the third cure plane bit CP3 may correspond to the third plane PL3, and the fourth cure plane bit CP4 may correspond to the fourth plane PL4.

The first cure plane bit CP1 may be provided to the nonvolatile memory device 120 through a first data line DQ1, the second cure plane bit CP2 may be provided to the nonvolatile memory device 120 through a second data line DQ2, the third cure plane bit CP3 may be provided to the nonvolatile memory device 120 through a third data line DQ3, and the fourth cure plane bit CP4 may be provided to the nonvolatile memory device 120 through a fourth data line DQ4. However, the present disclosure is not limited thereto. The first to fourth cure plane bits CP1 to CP4 may be sent through any data lines of the first to eight data lines DQ1 to DQ8.

A cure plane bit may indicate whether to perform the cure operation on a plane corresponding to the cure plane bit. For example, when a value of a cure plane bit is a first logical value, the nonvolatile memory device 120 may not perform the cure operation on a plane corresponding to the cure plane bit. When a value of a cure plane bit is a second logical value, the nonvolatile memory device 120 may perform the cure operation on a plane corresponding to the cure plane bit.

That is, the plane information may indicate a plane, on which the cure operation is to be performed, from among a plurality of planes. This will be more fully described with reference to FIGS. 14A and 14B.

In an embodiment, in a second cycle Cycle2, information about a start block address may be provided to the nonvolatile memory device 120 through the data lines DQ. In a third cycle Cycle3, information about the number of blocks may be provided to the nonvolatile memory device 120 through the data lines DQ. This will be more fully described with reference to FIGS. 15A and 15B.

In an embodiment, in a fourth cycle Cycle4, information about a cure voltage level may be provided to the nonvolatile memory device 120 through the data lines DQ. The information about a cure voltage level may indicate a level of a cure voltage to be applied to a plurality of word lines. The information about a cure voltage level may indicate a default level. For example, the default level may indicate a given level. The given level may be a level of the read pass voltage Vread.

The information about a cure voltage level may indicate a specific voltage level. The specific voltage level may be determined by the memory controller 110 in consideration of a program/erase cycle P/E Cycle, a read count, a program count, an erase count, the number of errors occurred in a read operation, an error rate, threshold voltage change information, wear-leveling information, degradation information, data input/output time information, temperature information, retention time information, and read disturb information.

In the case where the information about a cure voltage level indicates the default level, the nonvolatile memory device 120 may apply a voltage of the given level to a plurality of word lines. In the case where the information about a cure voltage level indicates the specific voltage level, the nonvolatile memory device 120 may apply a voltage of the specific voltage level to a plurality of word lines.

In an embodiment, in a fifth cycle Cycle5, information about a cure time may be provided to the nonvolatile memory device 120 through the data lines DQ. The information about a cure time may indicate a time during which a cure voltage is applied to a plurality of word lines. That is, the information about a cure time may indicate a pre-charge time.

The information about a cure time may indicate a default time. For example, the default time may indicate a given time. The information about a cure time may indicate a specific time. The specific time may be determined by the memory controller 110 in consideration of a program/erase cycle P/E Cycle, a read count, a program count, an erase count, the number of errors occurred in a read operation, an error rate, threshold voltage change information, wear-leveling information, degradation information, data input/output time information, temperature information, retention time information, and read disturb information.

In the case where the information about a cure time indicates the default time, the cure voltage may be applied to a plurality of word lines during the given time. In the case where the information about a cure time indicates the specific time, the cure voltage may be applied to a plurality of word lines during the specific time.

Figure 14A:
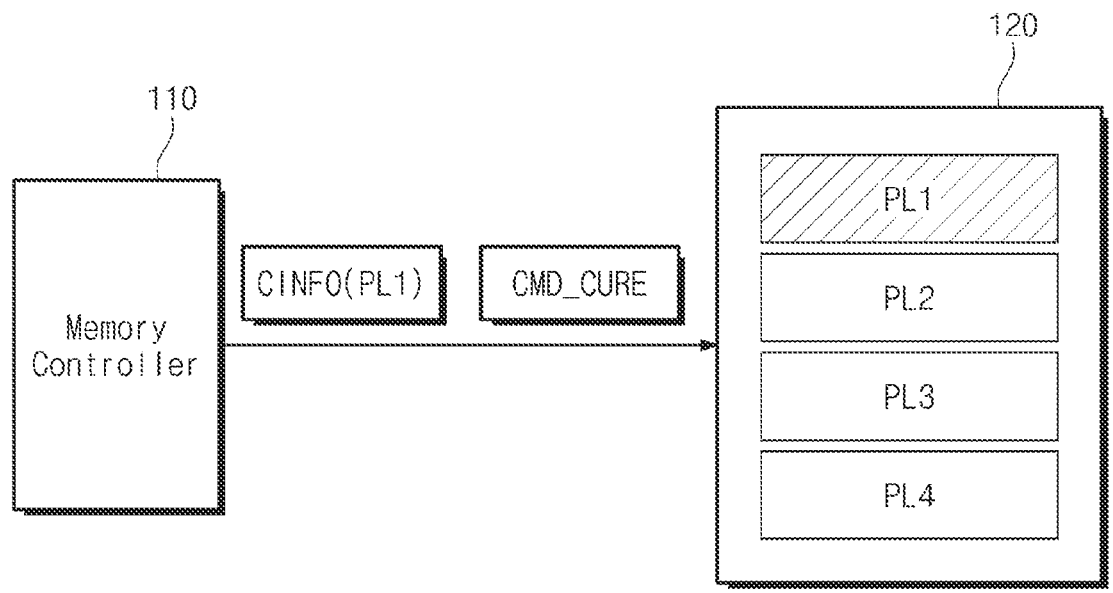
FIGS. 14A and 14B are diagrams for describing information about a plane of FIG. 13.
Figure 14B:
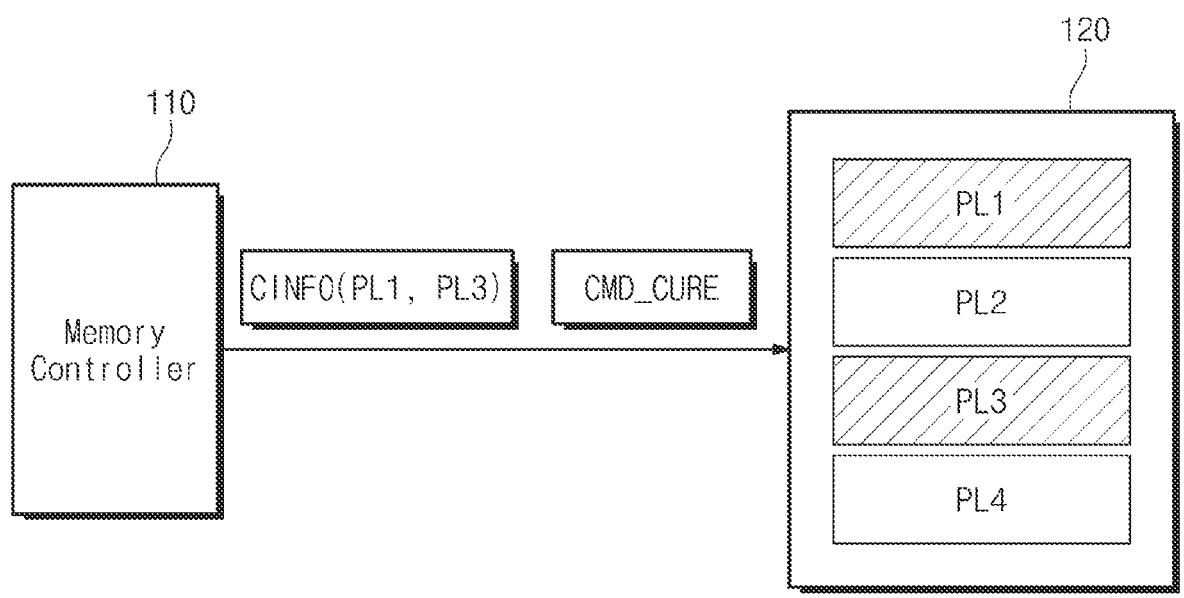

FIGS. 14A and 14B are diagrams for describing information about a plane of FIG. 13. For brevity of drawing, components unnecessary for description will be omitted. Referring to FIGS. 1, 14A, and 14B, the storage device 100 may include the memory controller 110 and the nonvolatile memory device 120. The memory cell array 122 of the nonvolatile memory device 120 may include the first to fourth planes PL1 to PL4. However, the present disclosure is not limited thereto. For example, the number of planes may be changed. Each of the first to fourth planes PL1 to PL4 may include a plurality of memory blocks. A memory block is described above, and thus, additional description will be omitted to avoid redundancy.

The memory controller 110 may send the cure command CMD_CURE to the nonvolatile memory device 120 through the data lines DQ. The memory controller 110 may send the cure information CINFO to the nonvolatile memory device 120 through the data lines DQ.

As illustrated in FIG. 14A, when plane information included in the cure information CINFO indicates the first plane PL1, the nonvolatile memory device 120 may perform the cure operation on the first plane PL1. That is, it is assumed that the first cure plane bit CP1 indicates the second logical value, the second cure plane bit CP2 indicates the first logical value, the third cure plane bit CP3 indicates the first logical value, and the fourth cure plane bit CP4 indicates the first logical value.

Because the first cure plane bit CP1 indicates the second logical value, the nonvolatile memory device 120 may perform the cure operation on the first plane PL1. Because the second to fourth cure plane bits CP2 to CP4 indicate the first logical value, the nonvolatile memory device 120 may not perform the cure operation on the second to fourth planes PL2 to PL4.

In contrast, as illustrated in FIG. 14B, when plane information included in the cure information CINFO indicates the first and third planes PL1 and PL3, the nonvolatile memory device 120 may perform the cure operation on the first and third planes PL1 and PL3. That is, it is assumed that the first cure plane bit CP1 indicates the second logical value, the second cure plane bit CP2 indicates the first logical value, the third cure plane bit CP3 indicates the second logical value, and the fourth cure plane bit CP4 indicates the first logical value.

Because the first and third cure plane bits CP1 and CP3 indicate the second logical value, the nonvolatile memory device 120 may perform the cure operation on the first and third planes PL1 and PL3. Because the second and fourth cure plane bits CP2 and CP4 indicate the first logical value, the nonvolatile memory device 120 may not perform the cure operation on the second and fourth planes PL2 and PL4.

As described above, the nonvolatile memory device 120 according to the present disclosure may determine planes targeted for the cure operation, based on plane information included in the cure information CINFO.

Figure 15A:
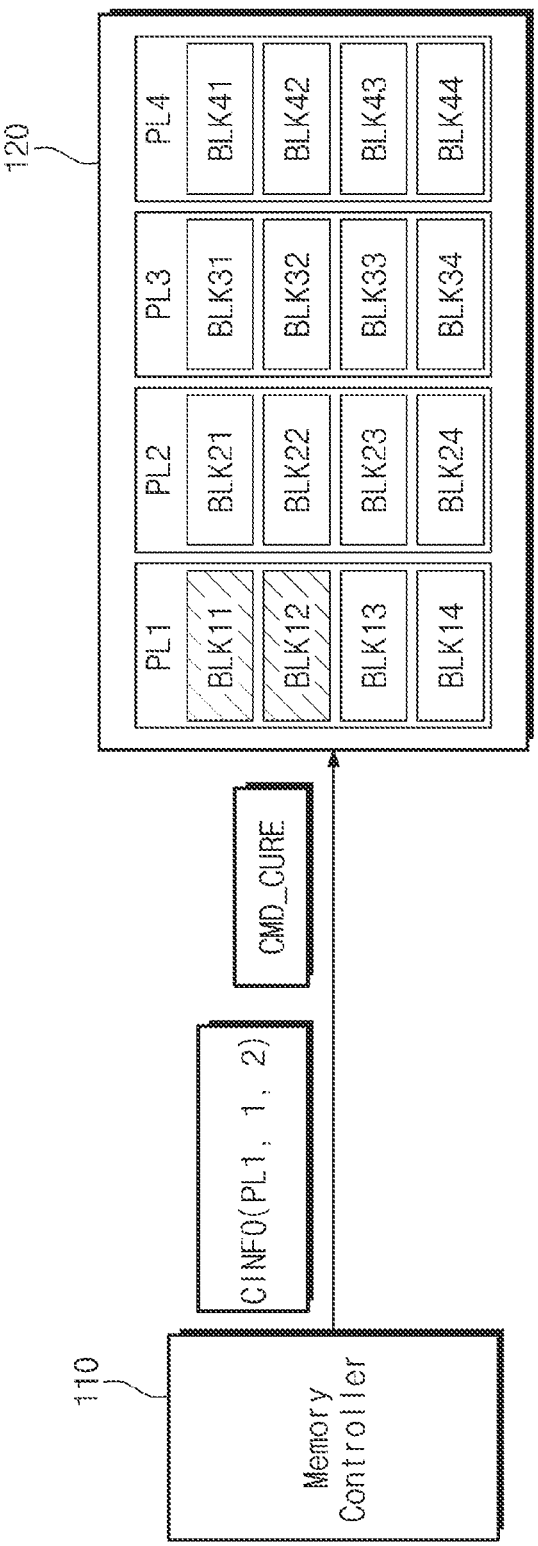
FIGS. 15A and 15B are diagrams for describing information about a start block address and information about the number of blocks of FIG. 13.
Figure 15B:
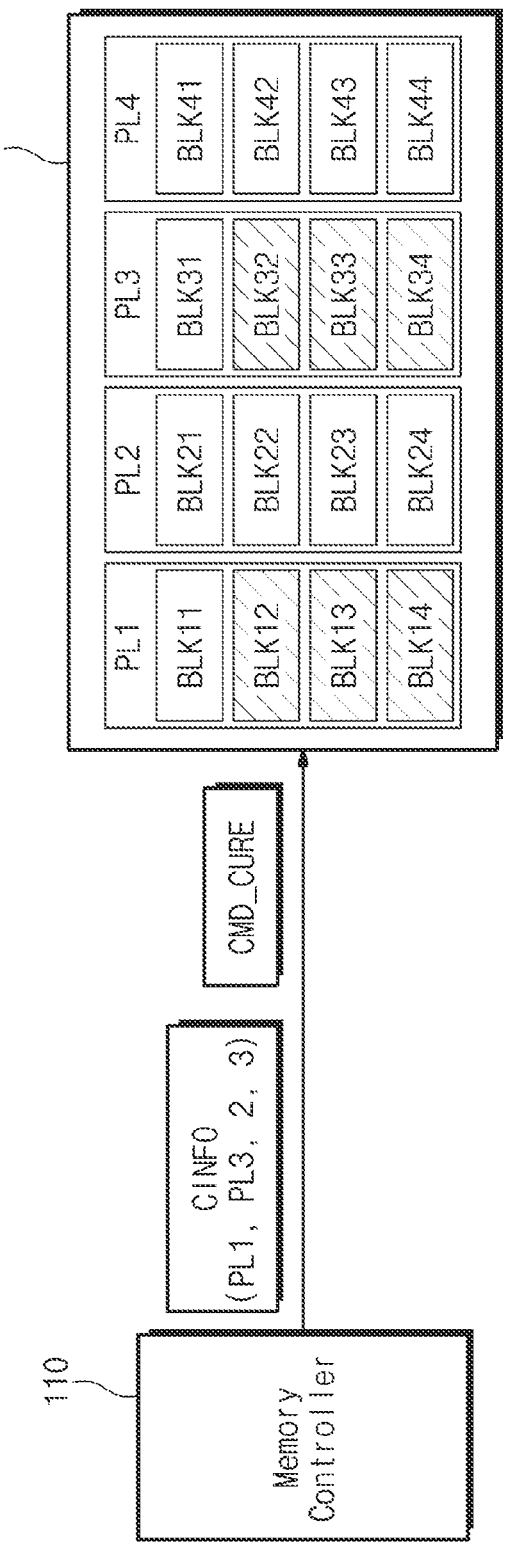

FIGS. 15A and 15B are diagrams for describing information about a start block address and information about the number of blocks of FIG. 13. A method of performing the cure operation on a part of a plurality of memory blocks will be described with reference to FIGS. 1, 13, 15A, and 15B. The storage device 100 may include the memory controller 110 and the nonvolatile memory device 120.

The memory cell array 122 of the nonvolatile memory device 120 may include a plurality of planes PL1 to PL4. Each of the plurality of planes PL1 to PL4 may include a plurality of memory blocks. For example, the plane PL1 may include a plurality of memory blocks BLK11 to BLK14, the plane PL2 may include a plurality of memory blocks BLK21 to BLK24, the plane PL3 may include a plurality of memory blocks BLK31 to BLK34, and the plane PL4 may include a plurality of memory blocks BLK41 to BLK44. In an embodiment, a plurality of memory blocks (e.g., BLK11 to BLK14) included in the same plane (e.g., PL1) may be configured to share the same bit lines, but the present disclosure is not limited thereto.

Each of the plurality of memory blocks BLK11 to BLK14, BLK21 to BLK24, BLK31 to BLK34, and BLK41 to BLK44 may be configured to store a plurality of pages. For example, each of the plurality of memory blocks BLK11 to BLK14, BLK21 to BLK24, BLK31 to BLK34, and BLK41 to BLK44 may include a plurality of memory cells, which are connected with a plurality of word lines. Memory cells connected with one word line may be configured to store at least one page. The number of pages stored in memory cells connected with one word line may vary depending on a way to program memory cells (e.g., an SLC, MLC, TLC, or QLC programming manner).

For brevity of drawing, an example is illustrated as one nonvolatile memory device 120 includes the first to fourth planes PL1 to PL4 and the first to fourth planes PL1 to PL4 include the plurality of memory blocks BLK11 to BLK14, BLK21 to BLK24, BLK31 to BLK34, and BLK41 to BLK44, but the present disclosure is not limited thereto. For example, the number of planes, the number of memory blocks, etc. may be variously changed or modified.

The memory controller 110 may send the cure command CMD_CURE to the nonvolatile memory device 120 through the data lines DQ. The memory controller 110 may send the cure information CINFO to the nonvolatile memory device 120 through the data lines DQ.

As illustrated in FIG. 15A, when plane information included in the cure information CINFO indicates the first plane PL1, information about a start block address included therein indicates "1", and information about the number of blocks included therein indicates "2", the nonvolatile memory device 120 may perform the cure operation on two memory blocks BLK11 and BLK12 of the first plane PL1.

That is, it is assumed that the first cure plane bit CP1 indicates the second logical value, the second cure plane bit CP2 indicates the first logical value, the third cure plane bit CP3 indicates the first logical value, and the fourth cure plane bit CP4 indicates the first logical value.

Because the first cure plane bit CP1 indicates the second logical value, the nonvolatile memory device 120 may perform the cure operation on the first plane PL1. Because the second to fourth cure plane bits CP2 to CP4 indicate the first logical value, the nonvolatile memory device 120 may not perform the cure operation on the second to fourth planes PL2 to PL4.

When the information about a start block address and the information about the number of blocks indicate a default value, the nonvolatile memory device 120 may perform the cure operation on all memory blocks included in the first plane PL1. However, because the information about a start block address indicates "1", the nonvolatile memory device 120 may determine the memory block BLK11 of the first plane PL1, which corresponds to a block address of "1", as a start point. Because the information about the number of blocks indicates "2", the nonvolatile memory device 120 may perform the cure operation on two memory blocks BLK11 and BLK12 from the start point.

In contrast, as illustrated in FIG. 15B, when plane information included in the cure information CINFO indicates the first and third planes PL1 and PL3, information about a start block address included therein indicates "2", and information about the number of blocks included therein indicates "3", the nonvolatile memory device 120 may perform the cure operation on three memory blocks BLK12, BLK13, and BLK14 of the first plane PL1 and three memory blocks BLK32, BLK33, and BLK34 of the third plane PL3.

That is, it is assumed that the first and third cure plane bits CP1 and CP3 indicate the second logical value and the second and fourth cure plane bits CP2 and CP4 indicate the first logical value. Because the first and third cure plane bits CP1 and CP3 indicate the second logical value, the nonvolatile memory device 120 may perform the cure operation on the first and third planes PL1 and PL3. Because the second and fourth cure plane bits CP2 and CP4 indicate the first logical value, the nonvolatile memory device 120 may not perform the cure operation on the second and fourth planes PL2 and PL4.

Because the information about a start block address indicates "2", the nonvolatile memory device 120 may determine the memory block BLK12 of the first plane PL1, which corresponds to a block address of "2", as a start point and may determine the memory block BLK32 of the third plane PL3, which corresponds to a block address of "2", as a start point. Because the information about the number of blocks indicates "3", the nonvolatile memory device 120 may perform the cure operation on three memory blocks BLK12, BLK13, and BLK14 of the first plane PL1 from the start point and may perform the cure operation on three memory blocks BLK32, BLK33, and BLK34 of the third plane PL3 from the start point.

As described above, the nonvolatile memory device 120 according to the present disclosure may determine memory blocks targeted for the cure operation, based on information about a start block address and information about the number of blocks included in the cure information CINFO.

According to the above embodiments, the nonvolatile memory device 120 may perform the cure operation in response to the cure command. In this case, the nonvolatile memory device 120 may determine a region targeted for the cure operation in various manners, based on information about a plane, information about a start block address, and information about the number of blocks. That is, it may be possible to perform the cure operation on all memory blocks included in the nonvolatile memory device 120 or to perform the cure operation on some memory blocks or some planes.

Figure 16:
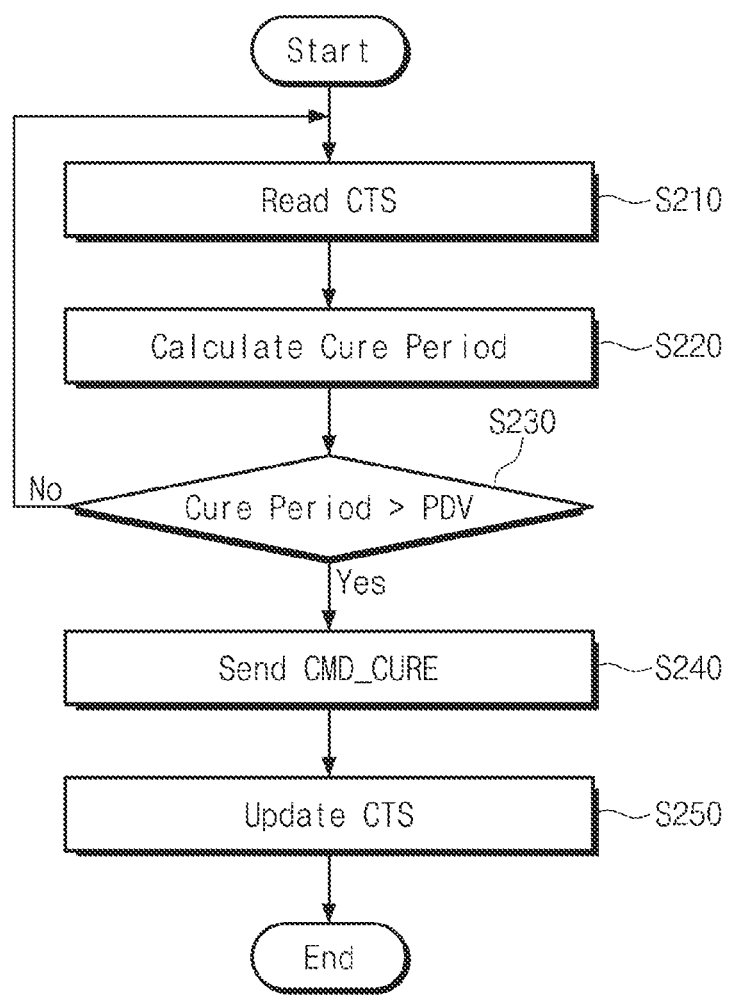
FIG. 16 is a flowchart illustrating an operation of a memory controller of FIG. 1.

FIG. 16 is a flowchart illustrating an operation of a memory controller of FIG. 1. Referring to FIGS. 1, 2, and 16, the memory controller 110 may periodically send the cure command CMD_CURE and the cure information CINFO to the nonvolatile memory device 120.

In operation S210, the memory controller 110 may read a cure time stamp CTS of the nonvolatile memory device 120. The cure time stamp CTS may include information about a previous cure time. The cure time stamp CTS may be stored in a buffer memory, the SRAM 112, or the nonvolatile memory device 120.

In an embodiment, in the case where the cure time stamp CTS is stored in the nonvolatile memory device 120, the memory controller 110 may load the cure time stamp CTS through a get feature command or a status read command. In the case where the cure time stamp CTS is stored in a meta region of the nonvolatile memory device 120, the memory controller 110 may load the cure time stamp CTS through a read command and an address of the meta region.

In an embodiment, the memory controller 110 may send the get feature command to the nonvolatile memory device 120 through the data lines DQ during the command input period CMD Input. Afterwards, the memory controller 110 may send a feature address to the nonvolatile memory device 120 through the data lines DQ during the address input period ADDR Input. For example, the feature address may indicate a space where the cure time stamp CTS is stored. Afterwards, the memory controller 110 may receive feature information through the data lines DQ during the data output period DATA Output. For example, the feature information may include information about the cure time stamp CTS.

In operation S220, the memory controller 110 may calculate a cure period by using the cure time stamp CTS and a current time. For example, the cure period may be calculated through a difference between a previous cure time read through the cure time stamp CTS and the current time.

In operation S230, the memory controller 110 may compare the cure period and a predetermined value PDV. When the cure period exceeds the predetermined value PDV, the memory controller 110 performs operation S240. When the cure period is equal to or less than the predetermined value PDV, the memory controller 110 performs operation S210.

In operation S240, the memory controller 110 may send the cure command CMD_CURE to the nonvolatile memory device 120. For example, the memory controller 110 may send the cure command CMD_CURE and the cure information CINFO to the nonvolatile memory device 120 through the data lines DQ. That is, the memory controller 110 may direct the nonvolatile memory device 120 to perform the cure operation.

In operation S250, the memory controller 110 may update the cure time stamp CTS. For example, the memory controller 110 may record the current time as a new cure time stamp CTS. In the case where the cure time stamp CTS is stored in the nonvolatile memory device 120, the memory controller 110 may record the new cure time stamp CTS through a set feature command. Alternatively, the memory controller 110 may record the new cure time stamp CTS through a write command and the address of the meta region. In an embodiment, the cure time stamp CTS may be updated after there is performed a program operation, an erase operation, or a read operation, as well as the cure operation.

In an embodiment, the memory controller 110 may send the set feature command to the nonvolatile memory device 120 through the data lines DQ during the command input period CMD Input. Afterwards, the memory controller 110 may send a feature address to the nonvolatile memory device 120 through the data lines DQ during the address input period ADDR Input. For example, the feature address may indicate a space where the cure time stamp CTS is to be stored. Afterwards, the memory controller 110 may send feature information to the nonvolatile memory device 120 through the data lines DQ during a data input period DATA Input. For example, the feature information may indicate information about the cure time stamp CTS updated to the current time.

In an embodiment, in the data input period DATA Input, the command latch enable signal CLE and the address latch enable signal ALE are logical low "L", and the read enable signal RE/ is logical high "H". In the data input period DATA Input, the memory controller 110 outputs the data DT through the data lines DQ in synchronization with a rising edge (↑) and a falling edge (↓) of the data strobe signal DQS.

As described above, the memory controller 110 may send the cure command CMD_CURE and the cure information CINFO to the nonvolatile memory device 120 at a given time interval or at a time interval corresponding to the cure period. As such, the memory controller 110 may prevent a decrease in threshold voltages of a plurality of memory cells included in the nonvolatile memory device 120.

To prevent a decrease in a threshold voltage, the memory controller 110 may periodically perform the dummy read operation. The memory controller 110 may read a previous dummy read time through a dummy read time stamp associated with a selected memory block. The memory controller 110 may calculate a dummy read period by using the previous dummy read time and a current time. When the dummy read period exceeds a predetermined value, the memory controller 110 may send a dummy read command associated with the selected memory block and may update a previous dummy read time stamp.

According to the above description, to periodically send a dummy read command, the memory controller 110 may store and manage dummy read time stamps associated with all memory blocks. The memory controller 110 additionally requires a storage space capable of storing the dummy read time stamps associated with all the memory blocks.

In contrast, the memory controller 110 according to an embodiment of the present disclosure may apply a cure voltage to a plurality of word lines of all memory blocks by using one cure command. Because the memory controller 110 requires one cure time stamp CTS, storage space may be saved.

Figure 17:
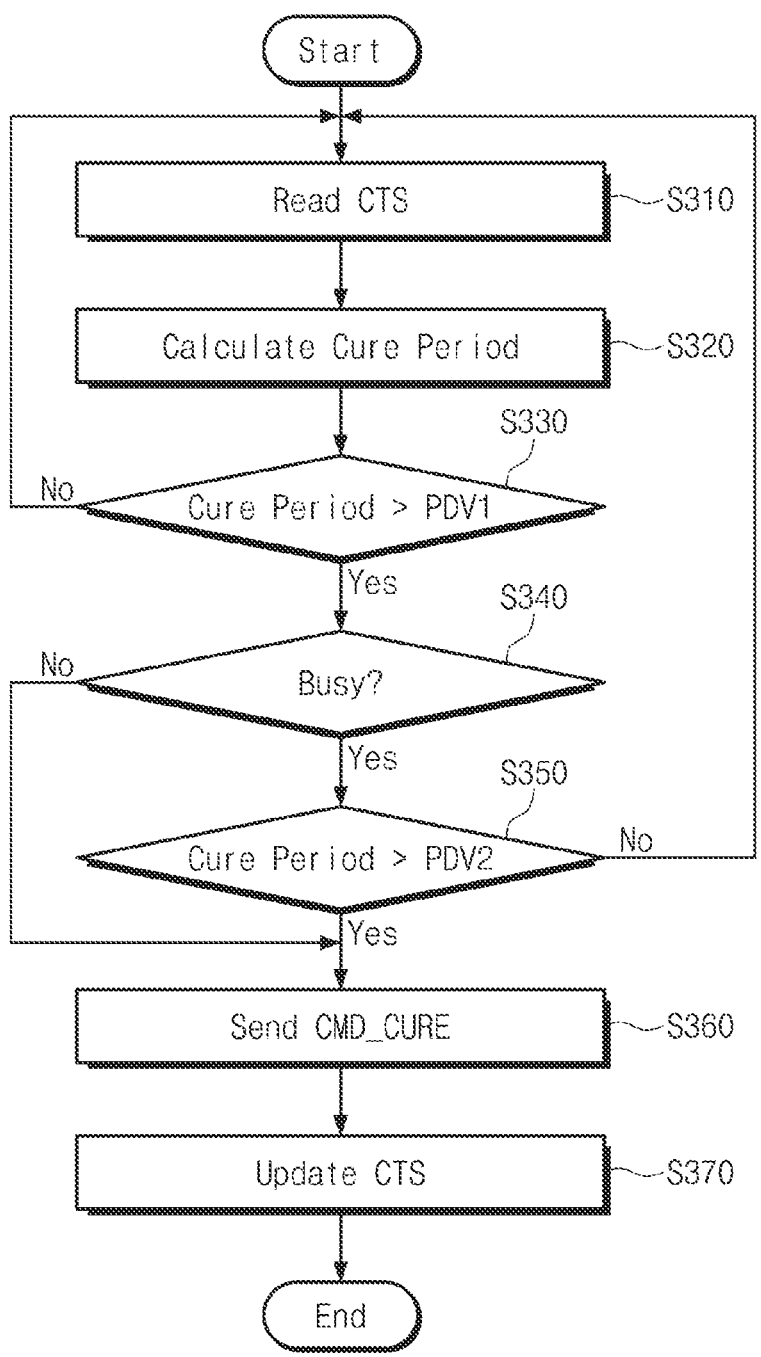
FIG. 17 is a flowchart illustrating an operation of a memory controller of FIG. 1.

FIG. 17 is a flowchart illustrating an operation of a memory controller of FIG. 1. Referring to FIGS. 1, 2, and 17, the memory controller 10 may periodically send the cure command CMD_CURE and the cure information CINFO.

In operation S310, the memory controller 110 may read the cure time stamp CTS of the nonvolatile memory device 120. The cure time stamp CTS may include a previous cure time.

In operation S320, the memory controller 110 may calculate a cure period by using the cure time stamp CTS and a current time. For example, the cure period may be calculated through a difference between a previous cure time read through the cure time stamp CTS and the current time.

In operation S330, the memory controller 110 may compare the cure period and a first predetermined value PDV1. When the cure period exceeds the first predetermined value PDV1, the memory controller 110 performs operation S340. When the cure period is equal to or less than the first predetermined value PDV1, the memory controller 110 performs operation S310.

In operation S340, the memory controller 110 may determine whether a current state is a busy state. When the current state is the busy state, the memory controller 110 performs operation S350. When the current state is not the busy state or is an idle state, the memory controller 110 performs operation S360.

In an embodiment, the busy state may indicate a state in which there exists a command, which is not yet processed, from among read or write commands received from a host. For example, the memory controller 110 may receive a write command or a read command from the host. In the case where a write command is received from the host, the memory controller 110 may store received data in the nonvolatile memory device 120. Afterwards, the memory controller 110 may send a completion to the host. In the case where a read command is received from the host, the memory controller 110 may receive data from the nonvolatile memory device 120 and may send the data to the host. Afterwards, the memory controller 110 may send a completion to the host. That is, the busy state may indicate a state where write or read commands are received from the host and at least one of completions corresponding to the received commands is not sent to the host.

In operation S350, the memory controller 110 may compare the cure period and a second predetermined value PDV2. In an embodiment, the second predetermined value PDV2 may be greater than the first predetermined value PDV1. When the cure period exceeds the second predetermined value PDV2, the memory controller 110 performs operation S360. When the cure period is equal to or less than the second predetermined value PDV2, the memory controller 110 performs operation S310.

In operation S360, the memory controller 110 may send the cure command CMD_CURE. In operation S370, the memory controller 110 may update a current time as the cure time stamp CTS.

As described above, as well as the first predetermined value PDV1, the second predetermined value PDV2 may be provided, and thus, the reduction of performance due to the cure operation may be prevented. When the current state is not the busy state and the cure period exceeds the first predetermined value PDV1, the memory controller 110 may send the cure command CMD_CURE and the cure information CINFO. When the current state is the busy state and the cure period exceeds the second predetermined value PDV2, the memory controller 110 may send the cure command CMD_CURE and the cure information CINFO.

That is, when the current state is not the busy state (i.e., is the idle state), the memory controller 110 may send the cure command CMD_CURE and the cure information CINFO at a time interval corresponding to the first predetermined value PDV1. The memory controller 110 may in advance allow the nonvolatile memory device 120 to perform the cure operation, and thus, the reduction of performance may be prevented. When the current state is the busy state, the memory controller 110 may perform the cure operation at a time interval corresponding to the second predetermined value PDV2. As such, a threshold voltage may be prevented from decreasing.

Figure 18:
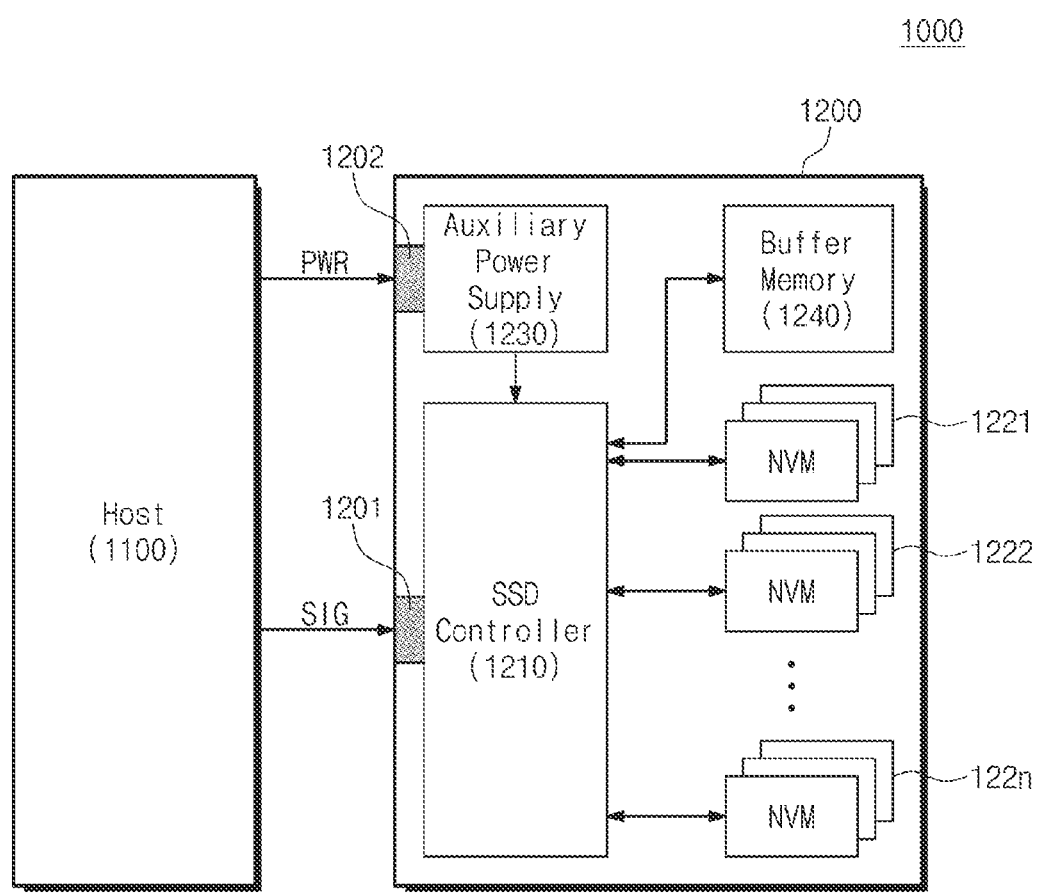
FIG. 18 is a block diagram illustrating a solid state drive system to which a storage system according to an embodiment of the present disclosure is applied.

FIG. 18 is a block diagram illustrating a solid state drive system to which a storage system according to an embodiment of the present disclosure is applied. Referring to FIG. 18, a solid state drive (SSD) system 1000 may include a host 1100 and an SSD 1200.

The SSD 1200 exchanges signals SIG with the host 1100 through a signal connector 1201 and is supplied with a power PWR through a power connector 1202. In an embodiment, the signal connector 1201 may include a PCIe port, the signals SIG may be signals defined in the NVMe protocol, and the SSD 1200 may include an NVMe-based storage device. The SSD 1200 includes an SSD controller 1210, a plurality of flash memories 1221 to 122n, an auxiliary power supply 1230, and a buffer memory 1240. In an embodiment, each of the plurality of flash memories 1221 to 122n may be implemented with a separate chip or a separate package and may be recognized as groups by the SSD controller 1210.

The SSD controller 1210 may control the plurality of flash memories 1221 to 122n in response to the signals SIG received from the host 1100. In an embodiment, the SSD controller 1210 may operate based on the operating method described with reference to FIGS. 1 to 17.

The plurality of flash memories 1221 to 122n may operate under control of the SSD controller 1210. The auxiliary power supply 1230 is connected with the host 1100 through the power connector 1202. The auxiliary power supply 1230 may be charged by the power PWR supplied from the host 1100. When the power PWR is not smoothly supplied from the host 1100, the auxiliary power supply 1230 may power the SSD 1200. In an embodiment, the plurality of flash memories 1221 to 122n may operate based on the operating method described with reference to FIGS. 1 to 17.

Figure 19:
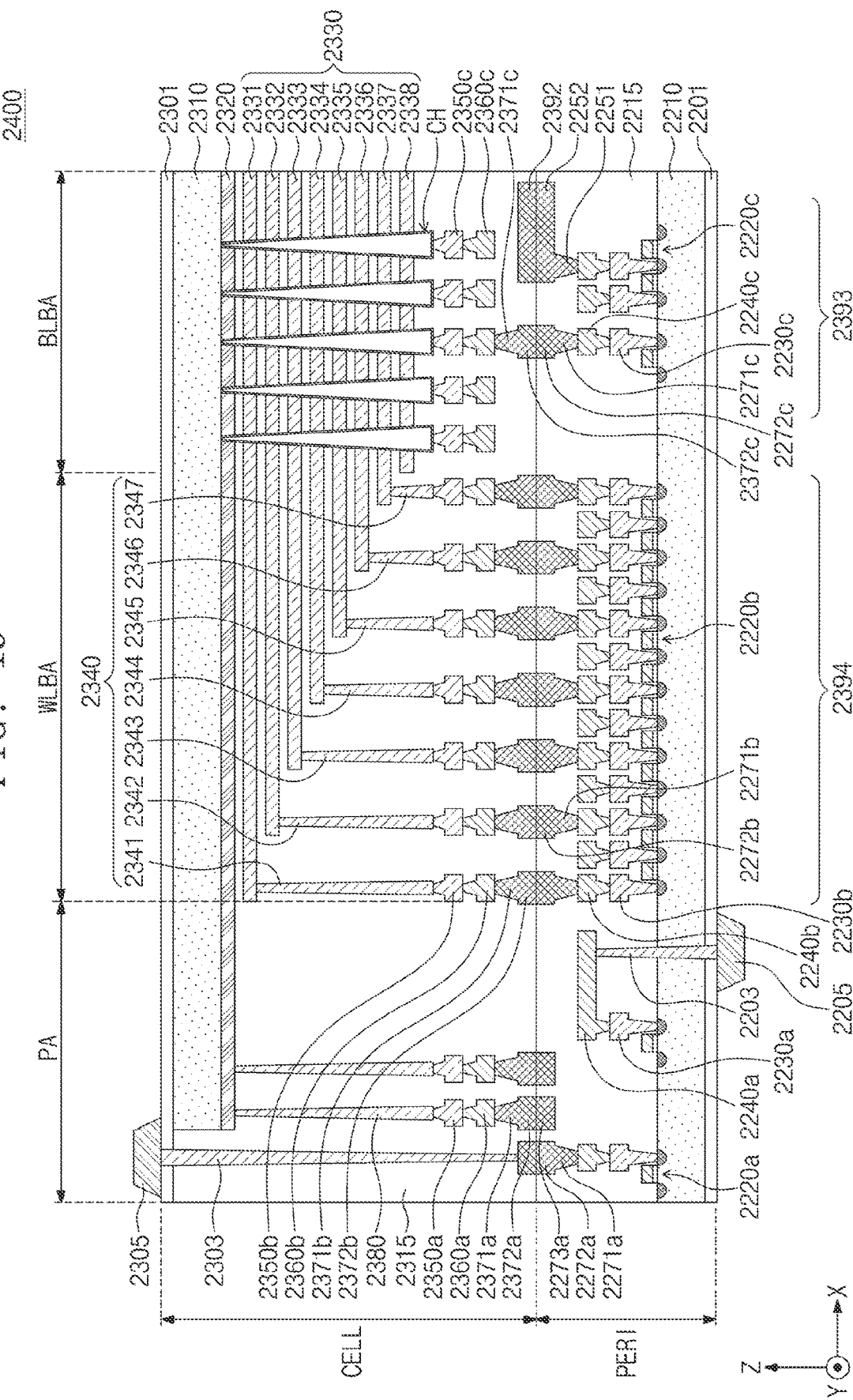
FIG. 19 is a view illustrating a nonvolatile memory device according to an embodiment of the present disclosure.

FIG. 19 is a diagram illustrating a nonvolatile memory device according to an embodiment of the present disclosure. Referring to FIG. 19, a nonvolatile memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a manner of electrically connecting a bonding metal formed on a lowermost metal layer of the upper chip and a bonding metal formed on an uppermost metal layer of the lower chip. For example, in the case where the bonding metal is formed of copper (Cu), the bonding manner may be a Cu-to-Cu bonding manner. The bonding metal may also be formed of aluminum (Al) or tungsten (W).

Each of the peripheral circuit region PERI and the cell region CELL of the nonvolatile memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected with the plurality of circuit elements 2220a, 2220b, and 2220c, and second metal layers 2240a, 2240b, and 2240c formed on the first metal layers 2230a, 2230b, and 2230c. In an embodiment, the first metal layers 2230a, 2230b, and 2230c may be formed of tungsten having a relatively high resistance, and the second metal layers 2240a, 2240b, and 2240c may be formed of copper having a relatively low resistance.

In the specification, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than that of copper forming the second metal layers 2240a, 2240b, and 2240c.

The interlayer insulating layer 2215 may be disposed on the first substrate 2210 to cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected with upper bonding metals 2371b and 2372b of the cell region CELL by Cu—Cu bonding. The lower bonding metals 2271b and 2272b and the upper bonding metals 2371b and 2372b may be formed of aluminum, copper, or tungsten.

Also, the upper bonding metals 2371b and 2372b in the cell region CELL may be referred as "first metal pads", and the lower bonding metals 2271b and 2272b in the peripheral circuit region PERI may be referred as "second metal pads".

The cell region CELL may include at least one memory block. The cell region CELL may include a second substrate 2310, an interlayer insulating layer 2315, and a common source line 2320. On the second substrate 2310, a plurality of word lines 2331 to 2338 (i.e., 2330) may be stacked in a direction (i.e., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

Widths of the plurality of word lines 2330 in the X-axis direction may be different. As a distance from the first substrate 2210 of the peripheral circuit region PERI increases, the widths of the plurality of word lines 2330 gradually increase. Likewise, as a distance from the second substrate 2310 of the cell region CELL increases, the widths of the plurality of word lines 2330 gradually decrease.

In the bit line bonding area BLBA, a channel structure CH may extend in a direction (i.e., a Z-axis direction) perpendicular to the upper surface of the second substrate 2310 and may pass through the plurality of word lines 2330, the string selection lines, and the ground selection line. The channel structure CH may include a data storage layer, a channel layer, a buried insulating layer, and the like, and the channel layer may be electrically connected with a first metal layer 2350c and a second metal layer 2360c. For example, the first metal layer 2350c may be a bit line contact, and the second metal layer 2360c may be a bit line. In an embodiment, the bit line 2360c may extend in a first direction (i.e., a Y-axis direction) parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In an embodiment illustrated in FIG. 19, an area in which the channel structure CH, the bit line 2360c, and the like are disposed may be defined as the bit line bonding area BLBA. In the bit line bonding area BLBA, the bit line 2360c may be electrically connected with the circuit elements 2220c constituting a page buffer 2393 in the peripheral circuit region PERI. For example, the bit line 2360c may be connected with upper bonding metals 2371c and 2372c in the cell region CELL, and the upper bonding metals 2371c and 2372c may be connected with lower bonding metals 2271c and 2272c connected with the circuit elements 2220c of the page buffer 2393.

In the word line bonding area WLBA, the plurality of word lines 2330 may extend in a second direction (i.e., an X-axis direction), which is perpendicular to the first direction and is parallel to the upper surface of the second substrate 2310, and may be connected with a plurality of cell contact plugs 2341 to 2347 (i.e., 2340). The word lines 2330 and the cell contact plugs 2340 may be connected with each other at pads provided by at least some of the plurality of word lines 2330, which extend in the second direction with different lengths. The first metal layer 2350b and the second metal layer 2360b may be sequentially connected with an upper portion of each of the cell contact plugs 2340 connected with the word lines 2330. The cell contact plugs 2340 may be connected with the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected with the circuit elements 2220b constituting a row decoder 2394 in the peripheral circuit region PERI. In an embodiment, operating voltages of the circuit elements 2220b constituting the row decoder 2394 may be different than operating voltages of the circuit elements 2220c constituting the page buffer 2393. For example, operating voltages of the circuit elements 2220c constituting the page buffer 2393 may be greater than operating voltages of the circuit elements 2220b constituting the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected with the common source line 2320. The first metal layer 2350a and the second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Meanwhile, input/output pads 2205 and 2305 may be disposed in the external pad bonding area PA. Referring to FIG. 19, a lower insulating film 2201 covering a lower surface of the first substrate 2210 may be formed below the first substrate 2210, and the first input/output pad 2205 may be formed on the lower insulating film 2201. The first input/output pad 2205 may be connected with at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 19, an upper insulating film 2301 covering the upper surface of the second substrate 2310 may be formed on the second substrate 2310, and the second input/output pad 2305 may be disposed on the upper insulating film 2301. The second input/output pad 2305 may be connected with at least one of the plurality of circuit elements 2220*a*, 2220*b*, and 2220*c* disposed in the peripheral circuit region PERI through a second input/output contact plug 2303 and lower bonding metals 2271*a* and 2272*a* of the peripheral circuit region PERI. In an embodiment, the second input/output pad 2305 may be electrically connected with the circuit element 2220*a*.

According to embodiments, the second substrate 2310 and the common source line 2320 may not be disposed in an area in which the second input/output contact plug 2303 is disposed. Also, the second input/output pad 2305 may not overlap the word lines 2330 in the third direction (i.e., the Z-axis direction). Referring to FIG. 19, the second input/output contact plug 2303 may be separated from the second substrate 2310 in a direction parallel to the upper surface of the second substrate 2310, may pass through the interlayer insulating layer 2315 of the cell region CELL, and may be connected with the second input/output pad 2305.

According to embodiments, the first input/output pad 2205 and the second input/output pad 2305 may be selectively formed. For example, the nonvolatile memory device 2400 may include only the first input/output pad 2205 disposed on the first substrate 2210 or the second input/output pad 2305 disposed on the second substrate 2310. Alternatively, the nonvolatile memory device 2400 may include both the first input/output pad 2205 and the second input/output pad 2305.

In each of the external pad bonding area PA and the bit line bonding area BLBA respectively included in the cell region CELL and the peripheral circuit region PERI, a metal pattern in the uppermost metal layer may be provided as a dummy pattern, or the uppermost metal layer may be absent.

In the external pad bonding area PA, the nonvolatile memory device 2400 may include a lower metal pattern 2273*a* in the uppermost metal layer of the peripheral circuit region PERI, and the lower metal pattern 2273*a* may correspond to an upper metal pattern 2372*a* formed in the uppermost metal layer of the cell region CELL and may have the same shape as the upper metal pattern 2372*a* of the cell region CELL. In the peripheral circuit region PERI, the lower metal pattern 2273*a* formed in the uppermost metal layer of the peripheral circuit region PERI may not be connected with a contact. As in the above description, in the external pad bonding area PA, the upper metal pattern 2372*a* that corresponds to the lower metal pattern 2273*a* formed in the uppermost metal layer of the peripheral circuit region PERI and has the same shape as the lower metal pattern 2273*a* of the peripheral circuit region PERI may be formed in the uppermost metal layer of the cell region CELL.

The lower bonding metals 2271*b* and 2272*b* may be formed on the second metal layer 2240*b* in the word line bonding area WLBA. In the word line bonding area WLBA, the lower bonding metals 2271*b* and 2272*b* of the peripheral circuit region PERI may be electrically connected with the upper bonding metals 2371*b* and 2372*b* of the cell region CELL by a bonding manner.

Also, in the bit line bonding area BLBA, an upper metal pattern 2392 that corresponds to a lower metal pattern 2252 formed in the uppermost metal layer of the peripheral circuit region PERI and has the same shape as the lower metal pattern 2252 of the peripheral circuit region PERI may be formed in the uppermost metal layer of the cell region CELL. A contact may not be formed on the upper metal pattern 2392 formed in the uppermost metal layer of the cell region CELL.

In an embodiment, a memory cell array or a memory block described with reference to FIGS. 1 to 15 may be included in the cell region CELL of FIG. 19. Peripheral circuits (e.g., an address decoder, a page buffer circuit, an input/output circuit, a control logic circuit, and a cure circuit) described with reference to FIGS. 1 to 15 may be included in the peripheral circuit region PERI.

As described above, the cure circuit may be included in the peripheral circuit region PERI and may perform the cure operation described with reference to FIGS. 1 to 15. That is, a cure voltage may be applied to a plurality of word lines of memory blocks in the memory cell region CELL. To apply a voltage to all word lines, a conventional nonvolatile memory device requires a plurality of dummy read operations. In contrast, a nonvolatile memory device according to an embodiment of the present disclosure may apply a voltage to all word lines through one cure command That is, a nonvolatile memory device capable of reducing the command overhead and improving performance is provided.

According to an embodiment of the present disclosure, a nonvolatile memory device may apply a cure voltage to a plurality of word lines through a cure command, and thus, a threshold voltage may be prevented from decreasing. Accordingly, a nonvolatile memory device capable of improving performance without performing a plurality of dummy read operations, a storage device including the nonvolatile memory device, and an operating method of the storage device are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A storage device comprising:
a nonvolatile memory device including a first memory block connected with a plurality of first word lines; and
a memory controller connected with the nonvolatile memory device through a plurality of data lines,
wherein:
the memory controller is configured to:
send a first command to the nonvolatile memory device through the plurality of data lines during a first command input period;
send a parameter to the nonvolatile memory device through the plurality of data lines during an address input period; and
send a second command to the nonvolatile memory device through the plurality of data lines during a second command input period, and
the nonvolatile memory device is configured to apply a turn-on voltage to all the plurality of first word lines connected with the first memory block based on the parameter during a first time in response to the first command and the second command.

2. The storage device of claim 1, wherein the nonvolatile memory device is configured to output a ready/busy signal of a busy state through a ready/busy line during the first time.

3. The storage device of claim 1, wherein:
the memory controller is configured to:
send a first read command to the nonvolatile memory device through the plurality of data lines during a third command input period;
send an address to the nonvolatile memory device through the plurality of data lines during a second address input period; and
send a second read command to the nonvolatile memory device through the plurality of data lines during a fourth command input period,
the nonvolatile memory device is configured to output data corresponding to the address through the plurality of data lines in response to the first and second read commands, and
the first and second read commands are different from the first and second commands.

4. The storage device of claim 1, wherein:
the nonvolatile memory device is configured to:
receive a first read command through the plurality of data lines during a third command input period;
receive a first address through the plurality of data lines during a second address input period;
receive a second read command through the plurality of data lines during a fourth command input period;
receive a third read command through the plurality of data lines during a fifth command input period;
output first data corresponding to the first address through the plurality of data lines in response to the third read command received in the fifth command input period;
receive the third read command through the plurality of data lines during a sixth command input period;
output second data corresponding to a second address through the plurality of data lines in response to the third read command received in the sixth command input period;
receive a fourth read command through the plurality of data lines during a seventh command input period; and
output third data corresponding to a third address through the plurality of data lines in response to the fourth read command, and
the first to fourth read commands are different from the first and second commands.

5. The storage device of claim 1, wherein:
the nonvolatile memory device is configured to:
receive a first read command through the plurality of data lines during a third command input period;
receive a first address through the plurality of data lines during a second address input period;
receive a second read command through the plurality of data lines during a fourth command input period;
receive the first read command through the plurality of data lines during a fifth command input period;
receive a second address through the plurality of data lines during a third address input period;
receive a third read command through the plurality of data lines during a sixth command input period;
output first data corresponding to the first address through the plurality of data lines in response to the third read command received in the sixth command input period;
receive the first read command through the plurality of data lines during a seventh command input period;
receive a third address through the plurality of data lines during a fourth address input period;
receive the third read command through the plurality of data lines during an eighth command input period;
output second data corresponding to the second address through the plurality of data lines in response to the third read command received in the eighth command input period;
receive a fourth read command through the plurality of data lines during a ninth command input period; and
output third data corresponding to the third address through the plurality of data lines in response to the fourth read command, and
the first to fourth read commands are different from the first and second commands.

6. The storage device of claim 1, wherein:
when the nonvolatile memory device does not receive another command after the first time, the nonvolatile memory device does not output data to the memory controller through the plurality of data lines, and
when the memory controller does not send another command after the first time, the memory controller does not output data to the nonvolatile memory device through the plurality of data lines.

7. The storage device of claim 1, wherein during the address input period, a command latch enable signal is logical low, an address latch enable signal is logical high, and the parameter is sent to the nonvolatile memory device in synchronization with a rising edge of a write enable signal.

8. The storage device of claim 1, wherein during the first command input period and the second command input period, a command latch enable signal is logical high, an address latch enable signal is logical low, and each of the first command and the second command is sent to the nonvolatile memory device in synchronization with a rising edge of a write enable signal.

9. The storage device of claim 1, wherein the parameter is sent to the nonvolatile memory device during 5 cycles of a write enable signal.

10. An operating method of a storage device which includes a nonvolatile memory device including a plurality of memory blocks and a memory controller, the method comprising:
- sending, by the memory controller, a first command to the nonvolatile memory device through a plurality of data lines during a first command input period;
- sending, by the memory controller, a parameter to the nonvolatile memory device through the plurality of data lines during an address input period after the first command input period;
- sending, by the memory controller, a second command to the nonvolatile memory device through the plurality of data lines during a second command input period after the address input period;
- receiving, by the memory controller, a ready/busy signal of a busy state through a ready/busy line during a first time after the second command input period; and
- applying, by the nonvolatile memory device, a turn-on voltage to all word lines connected with the plurality of memory blocks in response to the first and second commands.

11. The method of claim 10, further comprising loading a time stamp before the first command input period.

12. The method of claim 11, wherein:
the loading of the time stamp includes:
- sending, by the memory controller, a get feature command to the nonvolatile memory device through the plurality of data lines during a third command input period;
- sending, by the memory controller, a feature address to the nonvolatile memory device through the plurality of data lines during a second address input period after the third command input period; and
- sending, by the nonvolatile memory device, feature information to the memory controller through the plurality of data lines during a data output period after the second address input period, and the feature address indicates a space where the time stamp is stored and the feature information includes information about the time stamp.

13. The method of claim 10, further comprising updating a time stamp with a current time after the first time after the second command input period.

* * * * *